(12) United States Patent
Ichihara

(10) Patent No.: US 8,456,890 B2
(45) Date of Patent: Jun. 4, 2013

(54) MULTI-LEVEL RESISTANCE CHANGE MEMORY

(75) Inventor: Reika Ichihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 271 days.

(21) Appl. No.: 13/053,677

(22) Filed: Mar. 22, 2011

(65) Prior Publication Data
US 2012/0063193 A1    Mar. 15, 2012

(30) Foreign Application Priority Data

Sep. 15, 2010 (JP) ................................. 2010-207178

(51) Int. Cl.
*G11C 11/00* (2006.01)
(52) U.S. Cl.
USPC .......................................... 365/148; 365/100
(58) Field of Classification Search
USPC ................................. 365/148, 100
See application file for complete search history.

(56) References Cited

U.S. PATENT DOCUMENTS 7,593,257 B2 *   9/2009   Murayama et al. ........... 365/177
2009/0213642 A1  8/2009   Raberg et al.

FOREIGN PATENT DOCUMENTS

JP    2005-522045    7/2005

OTHER PUBLICATIONS

H. Y. Lee et al., "Low Power and High Speed Bipolar Switching with a Thin Reactive Ti Buffer Layer in Robust HfO$_2$ Based BRAM", IEEE, 2008, pp. 297-300.
U.S. Appl. No. 13/234,796, filed Sep. 16, 2011, Takashima, et al.
U.S. Appl. No. 13/239,899, filed Sep. 22, 2011, Ichihara, et al.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a multi-level resistance change memory includes a memory cell includes first and second resistance change films connected in series, and a capacitor connected in parallel to the first resistance change film, a voltage pulse generating circuit generating a first voltage pulse with a first pulse width to divide a voltage of the first voltage pulse into the first and second resistance change films based on a resistance ratio thereof, and generating a second voltage pulse with a second pulse width shorter than the first pulse width to apply a voltage of the second voltage pulse to the second resistance change film by a transient response of the capacitor, and a control circuit which is stored multi-level data to the memory cell by using the first and second voltage pulses in a writing.

11 Claims, 40 Drawing Sheets

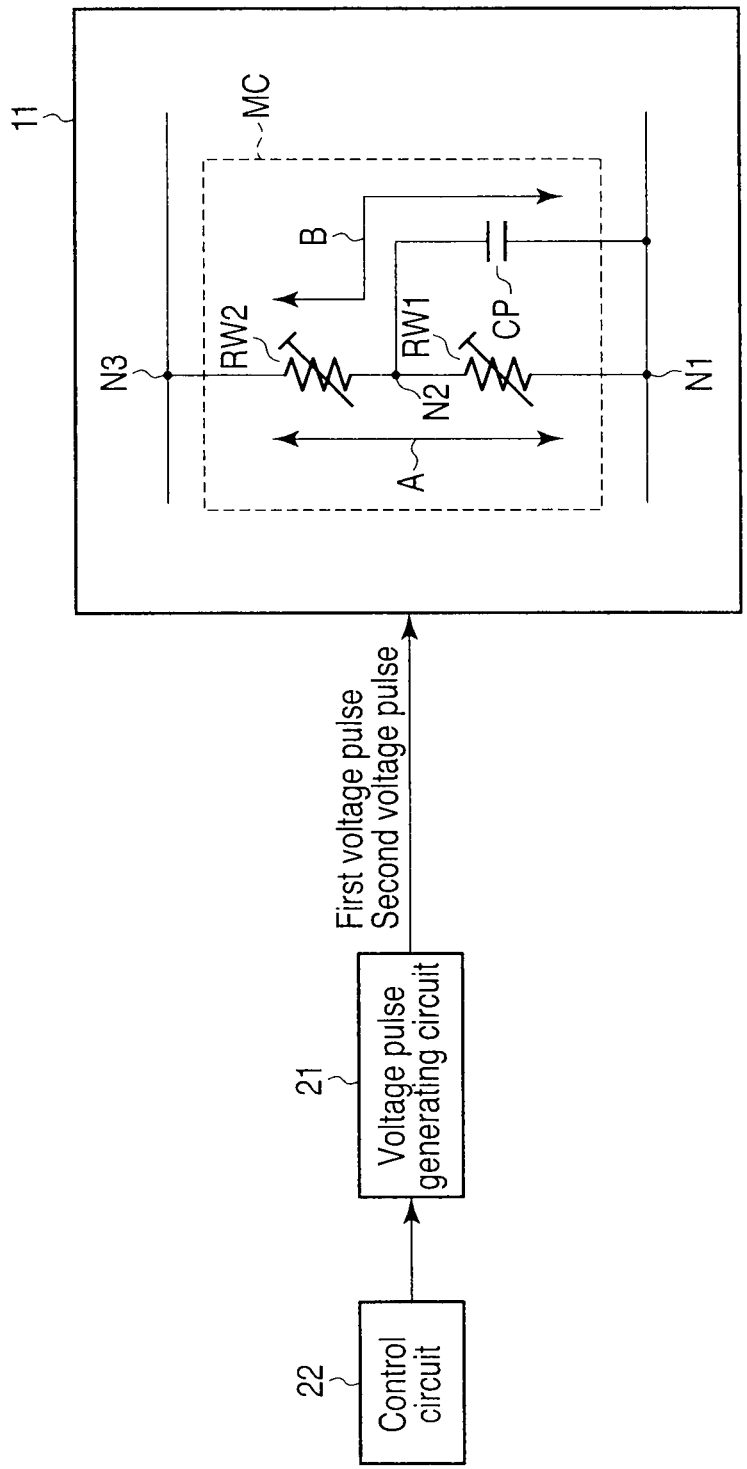
F I G. 1

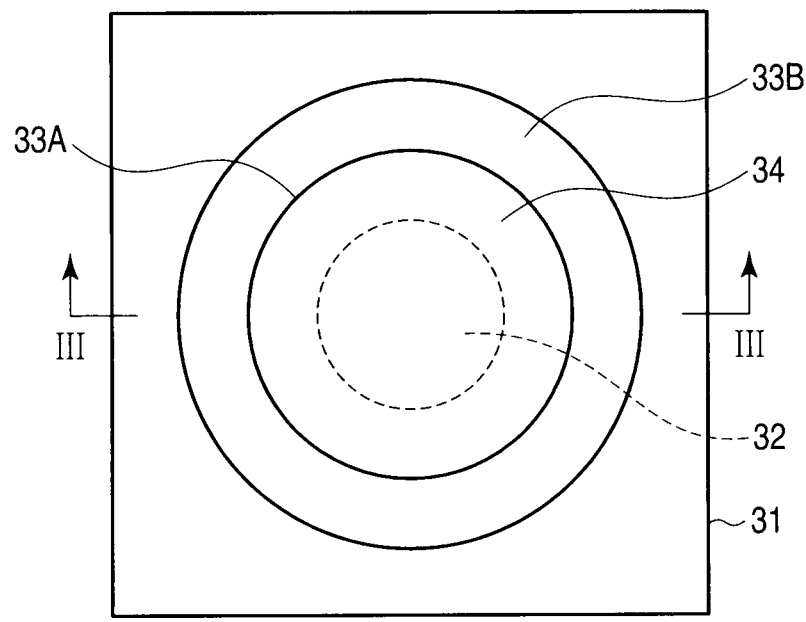
F I G. 2
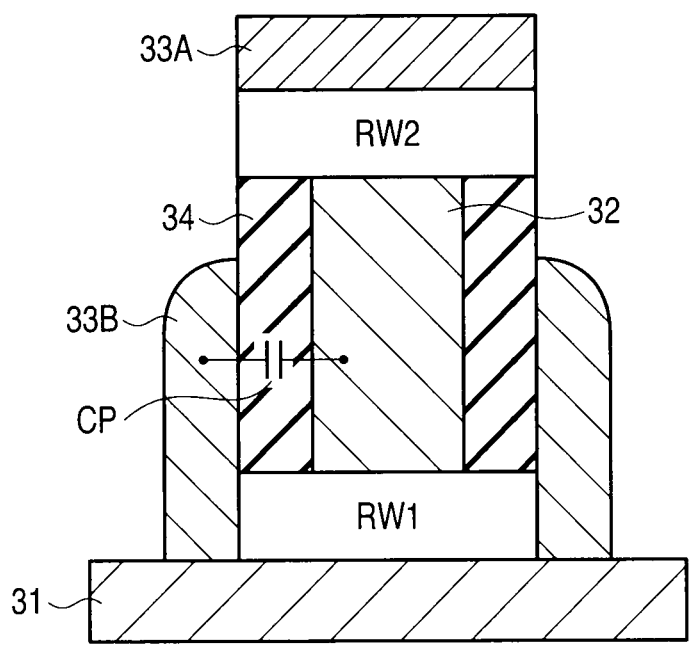
F I G. 3

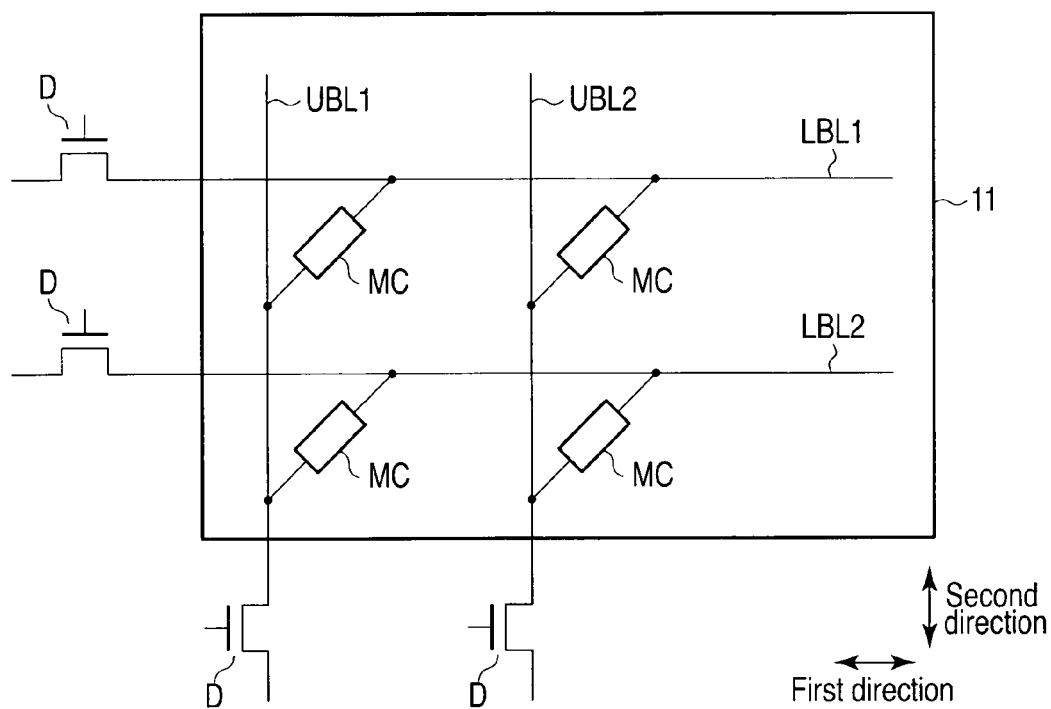
F I G. 10
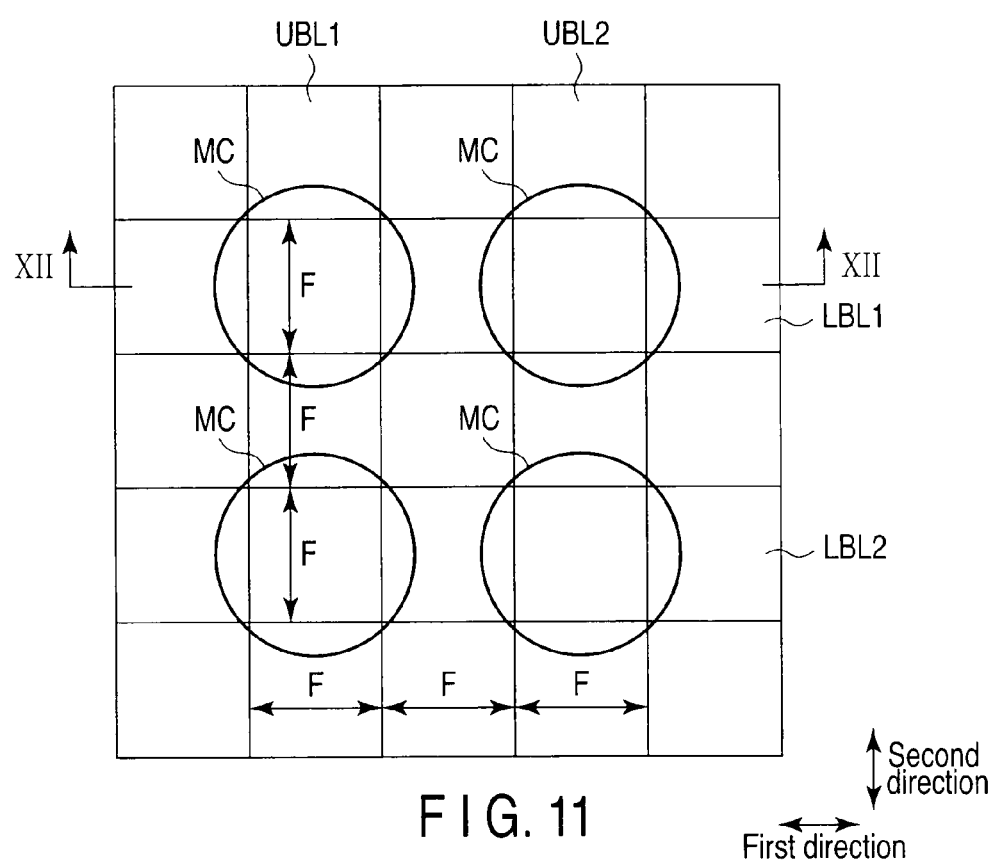
F I G. 11

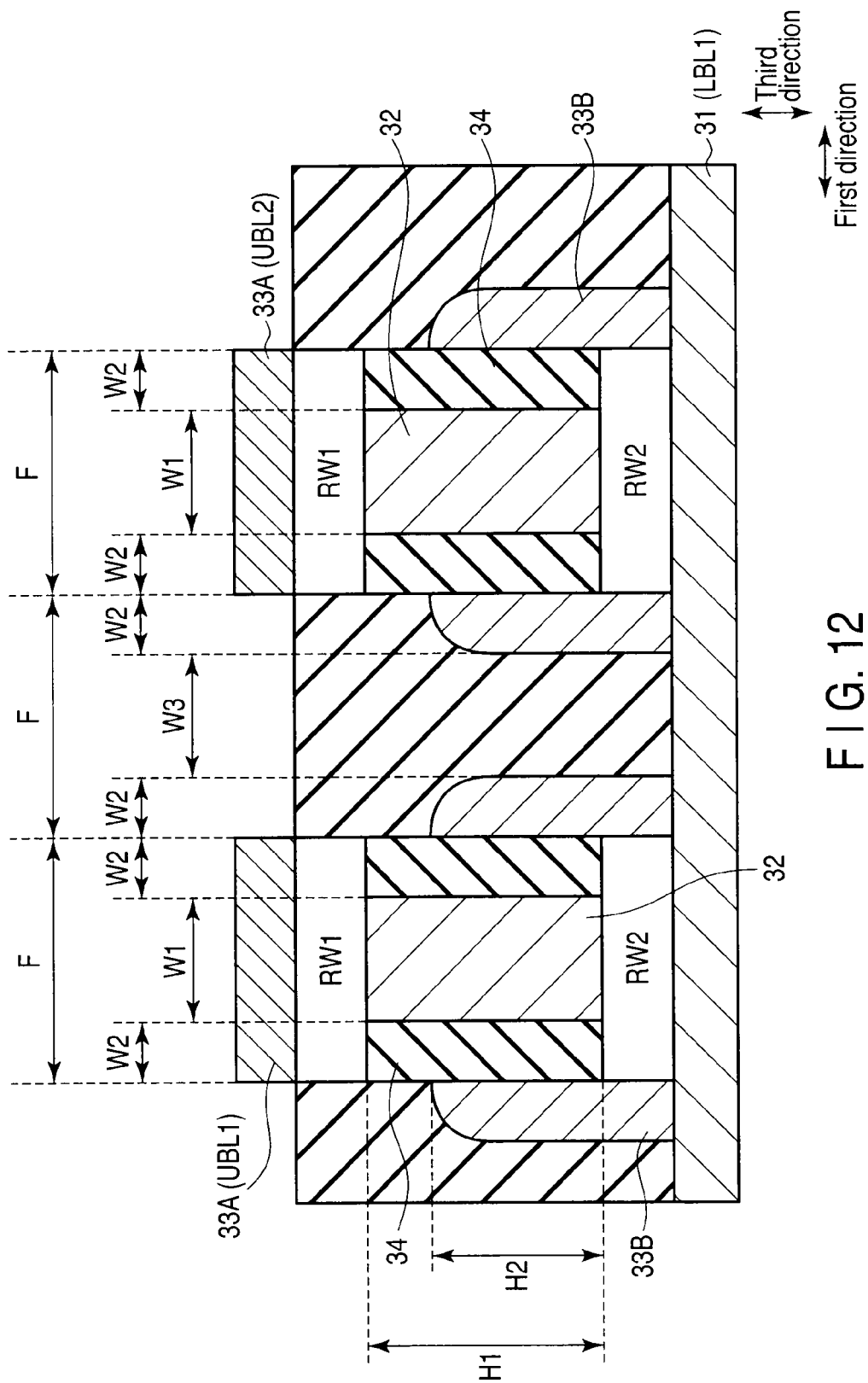
F I G. 12

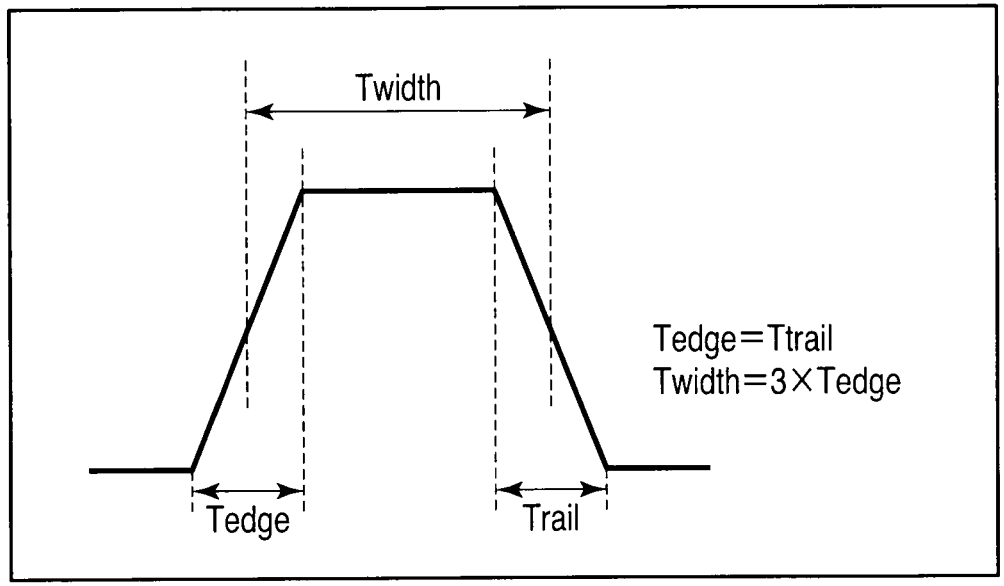
F I G. 13
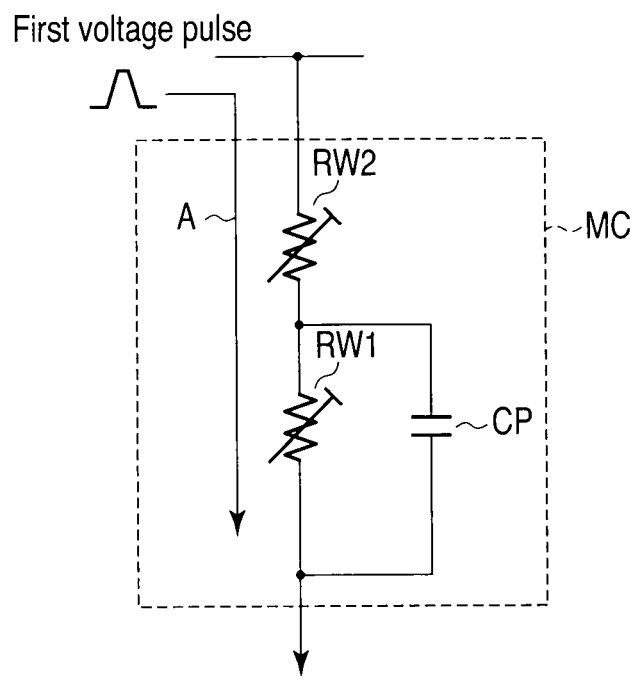
F I G. 14

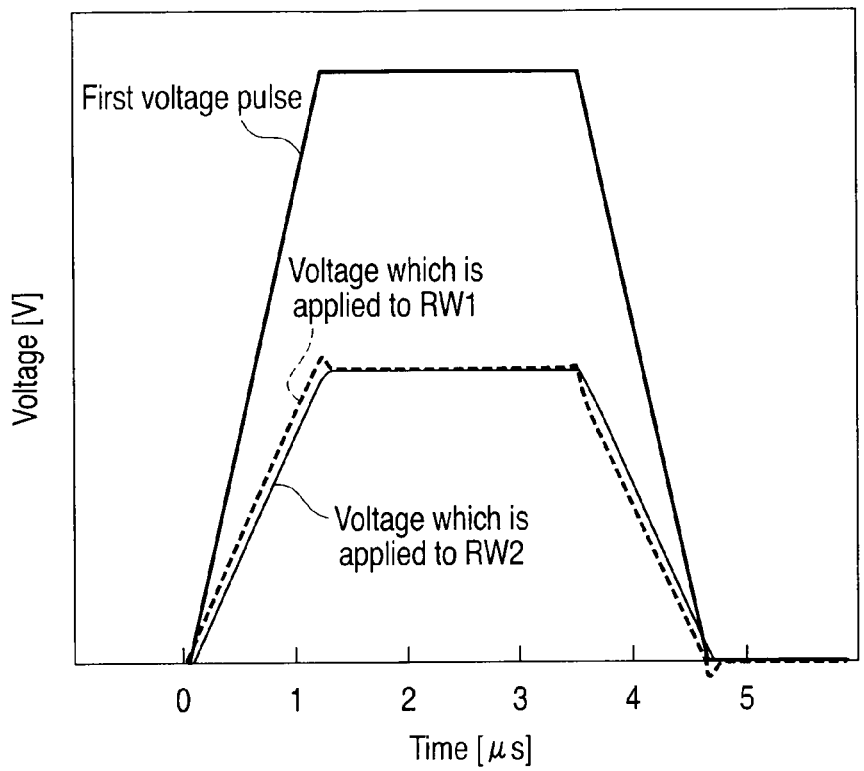
F I G. 15
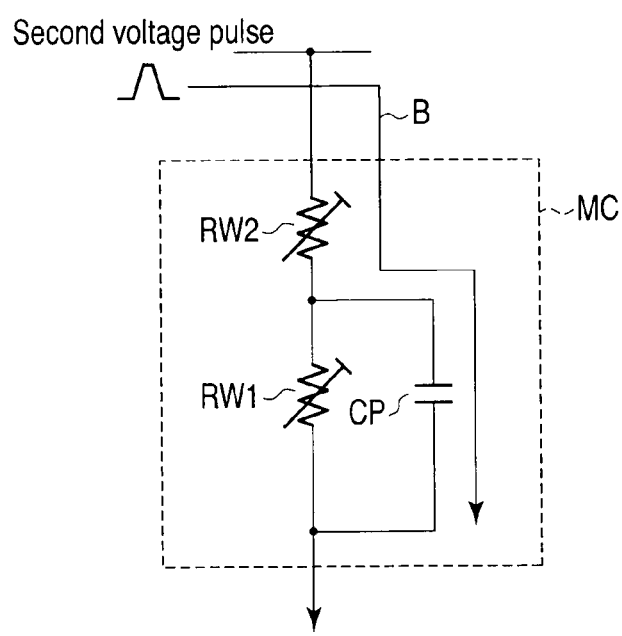
F I G. 16

| Writing of multi-level data (set) ||||
|---|---|---|---|
| Cell-state | Resistance change film | Resistance after writing | Voltage pulse |
| A<br>set "11" | RW2 | Ron (Low) | First voltage pulse (V1-set)<br>RW1 and RW2 are both set |
| | RW1 | Ron (Low) | |
| B<br>set "10" | RW2 | Ron (Low) | Second voltage pulse (V2-set)<br>RW2 is set |
| | RW1 | Roff (High) | |
| C<br>set "01" | RW2 | Roff (High) | First voltage pulse (V1-set)    Second voltage pulse (V2-reset)<br>RW1 and RW2 are both set → RW2 is reset |
| | RW1 | Ron (Low) | |
| D<br>reset "00" | RW2 | Roff (High) | |
| | RW1 | Roff (High) | |

FIG. 18

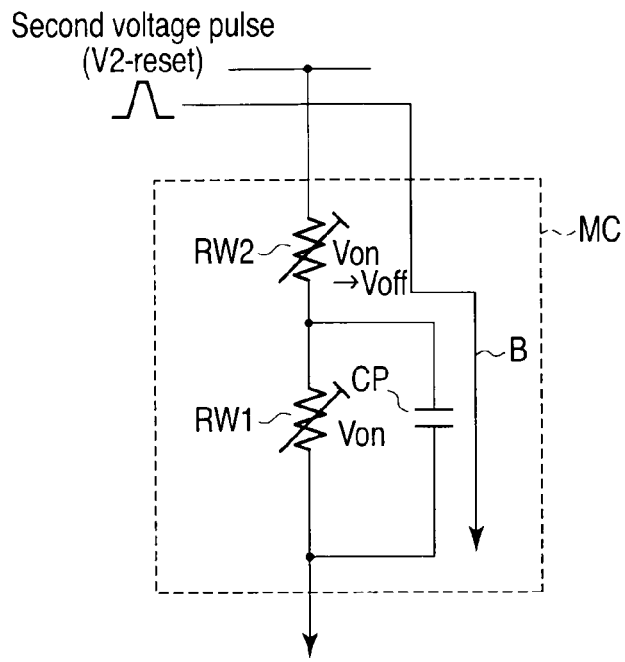
F I G. 23
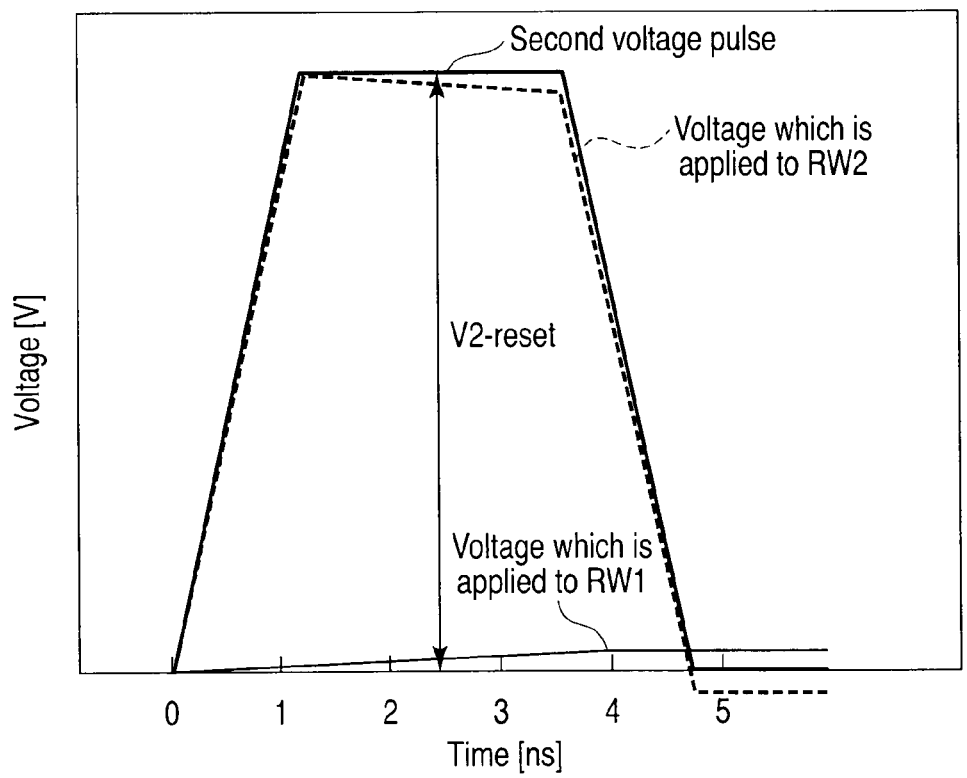
F I G. 24

| Erasing of muliti-level data (reset) ||||
|---|---|---|---|
| Cell-state | Resistance change film | Resistance before erasing | Voltage pulse |
| A set "11" | RW2 | Ron (Low) | Second voltage pulse (V2-set): No change / First voltage pulse (V1-set): No change / First voltage pulse (V1-reset): RW1 and RW2 are both reset |
| | RW1 | Ron (Low) | |
| B set "10" | RW2 | Ron (Low) | No change / RW1 is set / RW1 and RW2 are both reset |
| | RW1 | Roff (High) | |
| C set "01" | RW2 | Roff (High) | RW2 is set / No change / RW1 and RW2 are both reset |
| | RW1 | Ron (Low) | |
| D set "00" | RW2 | Roff (High) | RW2 is set / RW1 is set / RW1 and RW2 are both reset |
| | RW1 | Roff (High) | |

F I G. 25

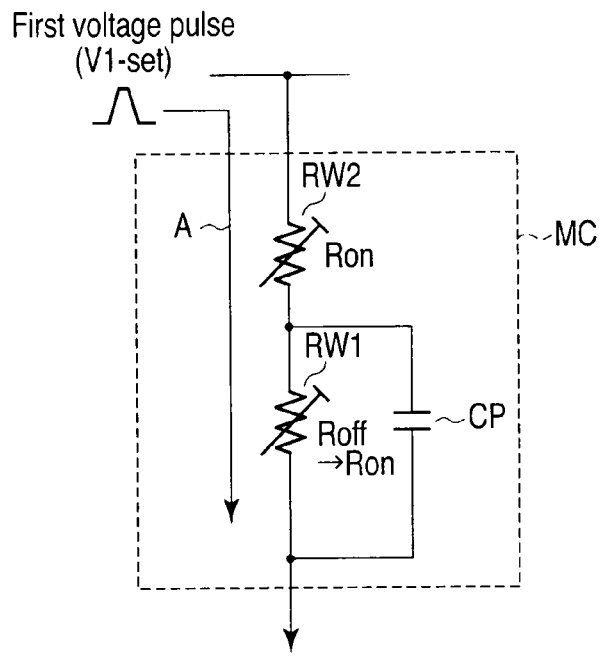
F I G. 28
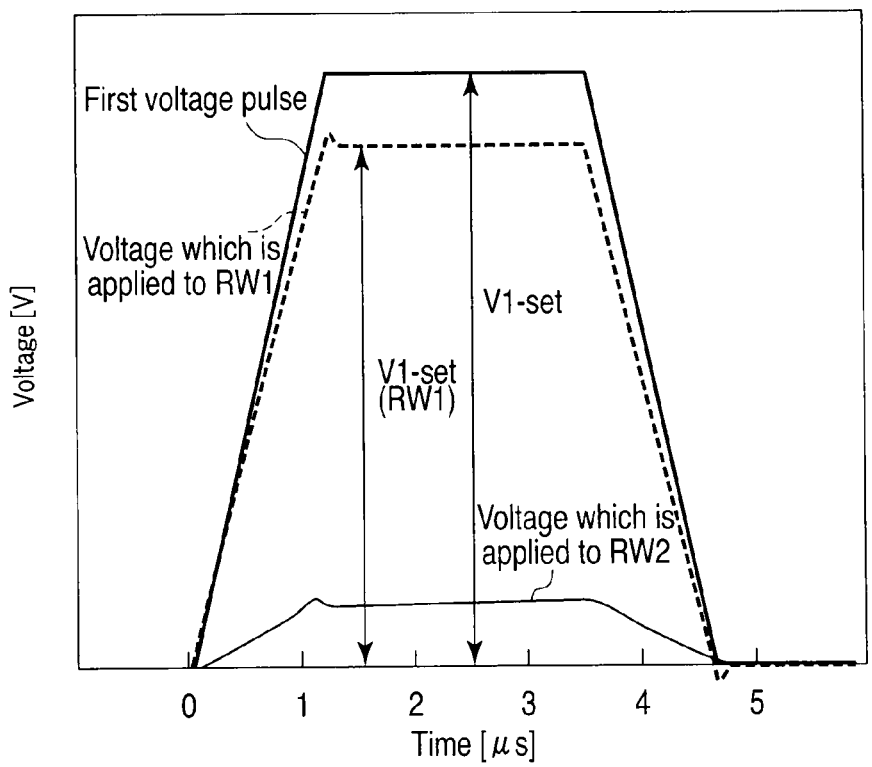
F I G. 29

| Reading of multi-level data ||||| 
|---|---|---|---|---|
| Cell-state | Resistance change film | Resistance after writing | First voltage pulse | Second voltage pulse |
| A set "11" | RW2 | Ron (Low) | Rmin | Ron |
| | RW1 | Ron (Low) | | |
| B set "10" | RW2 | Ron (Low) | Rmid | Ron |
| | RW1 | Roff (High) | | |
| C set "01" | RW2 | Roff (High) | Rmid | Roff |
| | RW1 | Ron (Low) | | |
| D reset "00" | RW2 | Roff (High) | Rmax | Roff |
| | RW1 | Roff (High) | | |

F I G. 32

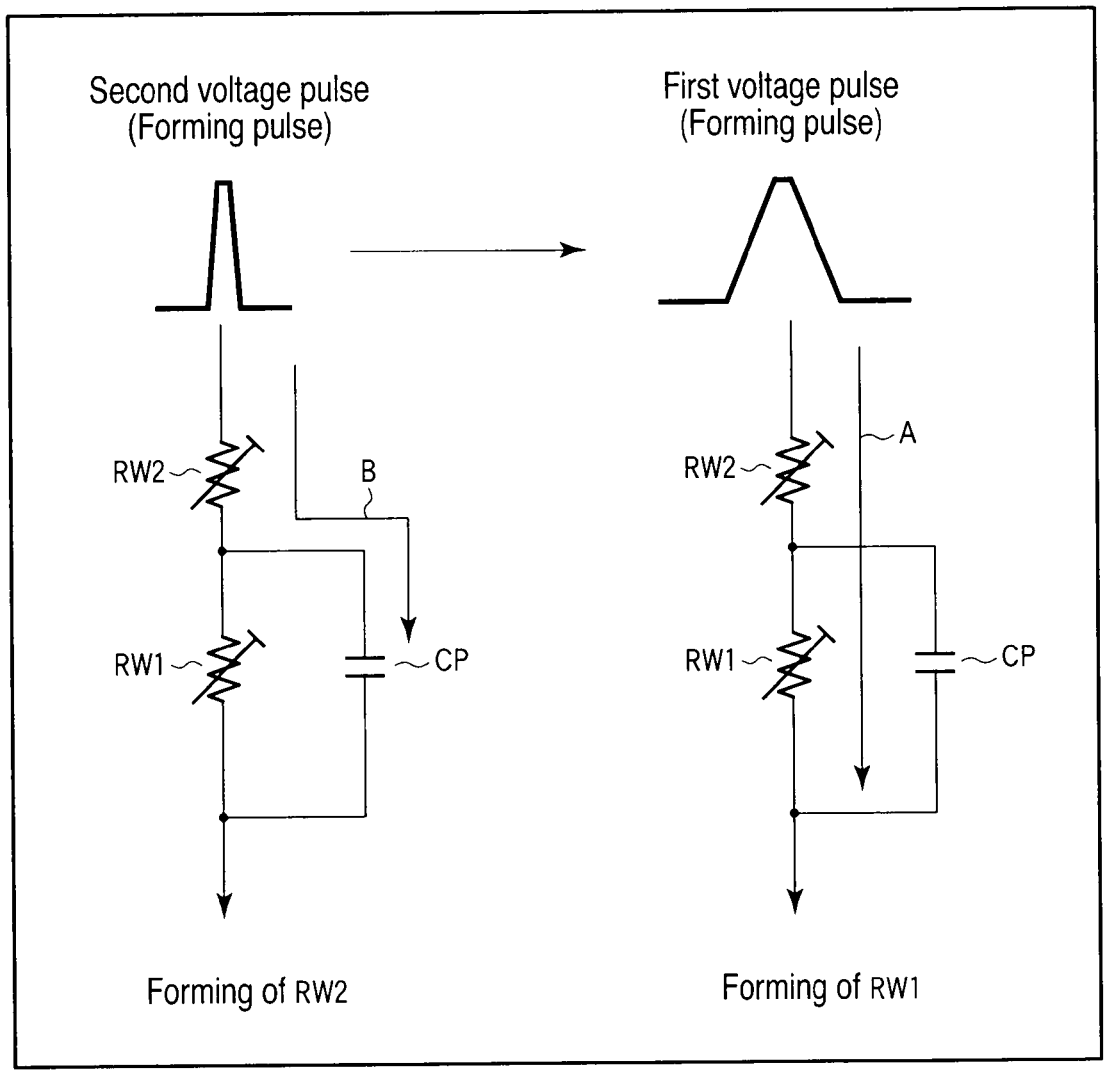
F I G. 38

| Cell-state | Resistance change film | Resistance after writing | Voltage pulse |
|---|---|---|---|
| A set "11" | RW2 | Ron (Low) | Second voltage pulse (V2-set)   First voltage pulse (V1-set) |
| | RW1 | Ron (Low) | RW2 is set    RW1 is set |
| B set "10" | RW2 | Ron (Low) | Second voltage pulse (V2-set) |
| | RW1 | Roff (High) | RW2 is set |
| C set "01" | RW2 | Roff (High) | First voltage pulse (V1-set) |
| | RW1 | Ron (Low) | RW1 is set |
| D reset "00" | RW2 | Roff (High) | |
| | RW1 | Roff (High) | |

Writing of multi-level data (set)

F I G. 39

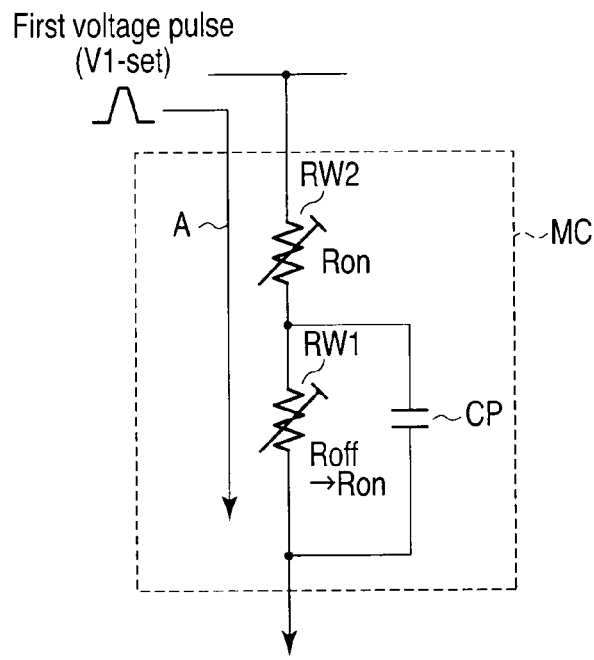
F I G. 42
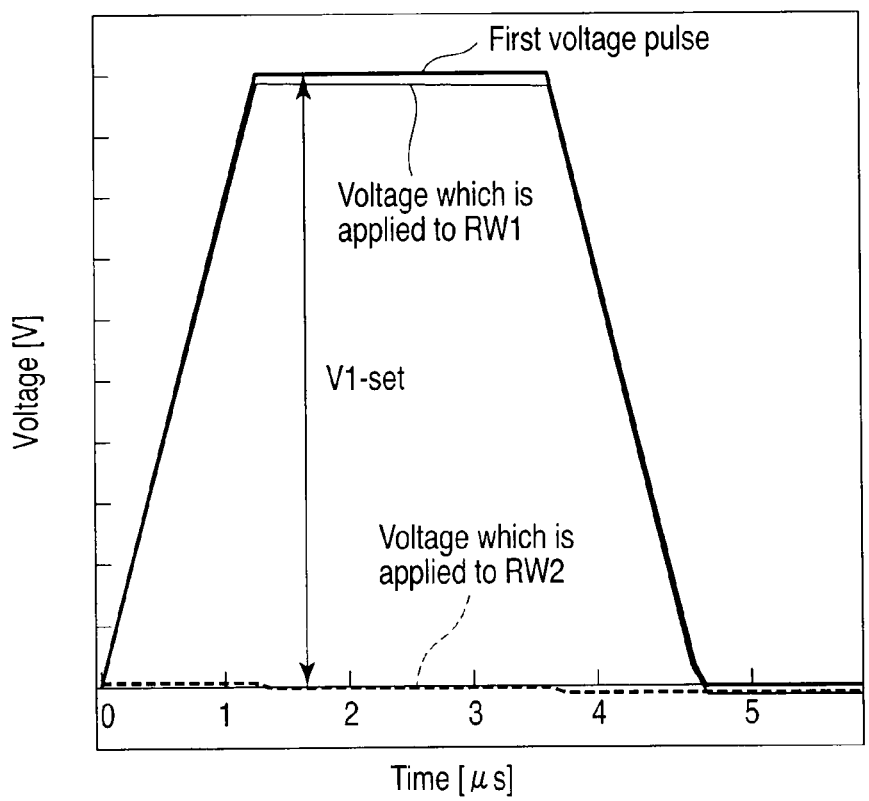
F I G. 43

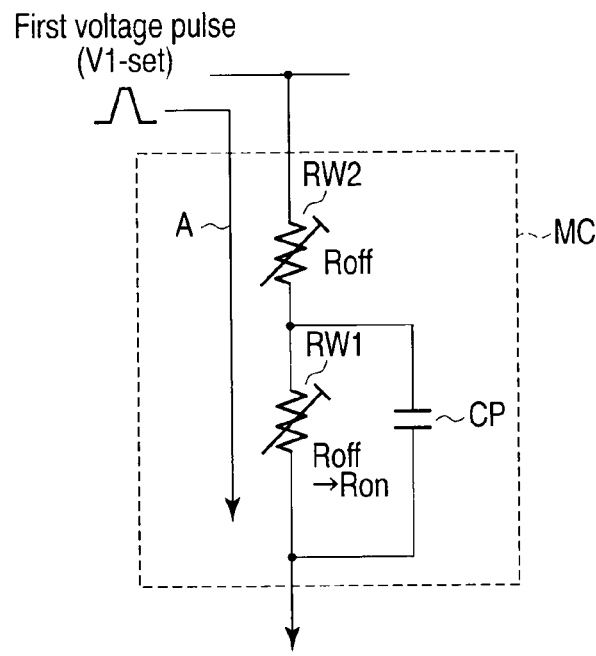
F I G. 44
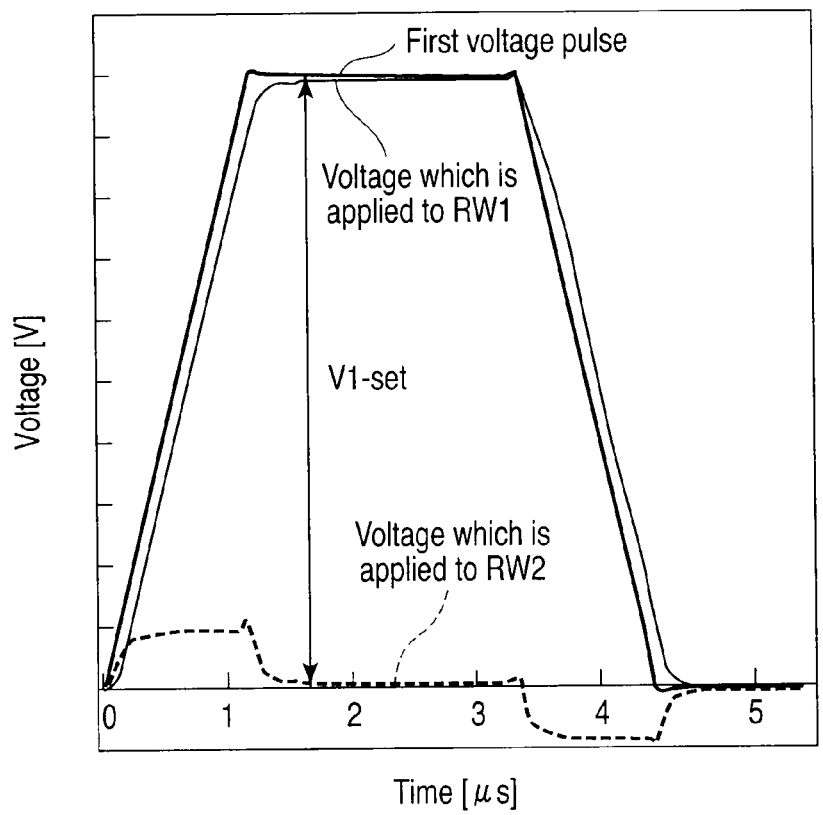
F I G. 45

| Erasing of multi-level data (reset) ||||
|---|---|---|---|
| Cell-state | Resistance change film | Resistance before erasing | Voltage pulse |
| A set "11" | RW2 | Ron (Low) | Second voltage pulse (V2-reset): RW2 is reset; First voltage pulse (V1-reset): RW1 is reset |
| | RW1 | Ron (Low) | |
| B set "10" | RW2 | Ron (Low) | RW2 is reset |
| | RW1 | Roff (High) | No change |
| C set "01" | RW2 | Roff (High) | No change |
| | RW1 | Ron (Low) | RW1 is reset |
| D reset "00" | RW2 | Roff (High) | No change |
| | RW1 | Roff (High) | No change |

F I G. 46

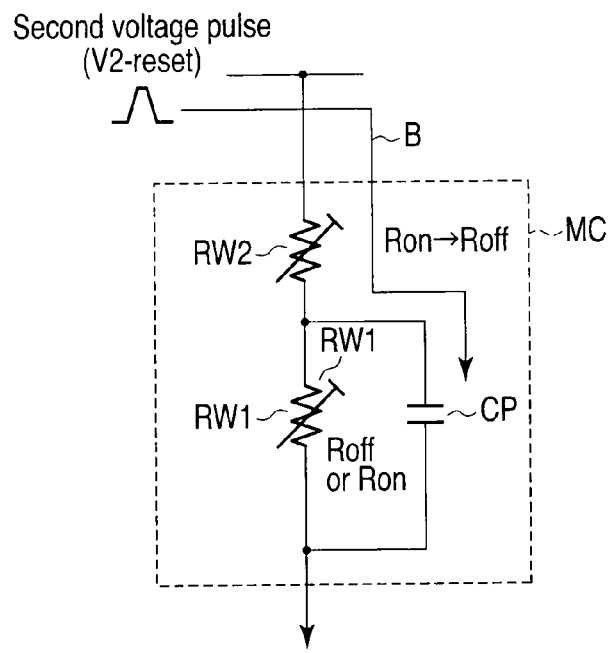
F I G. 47
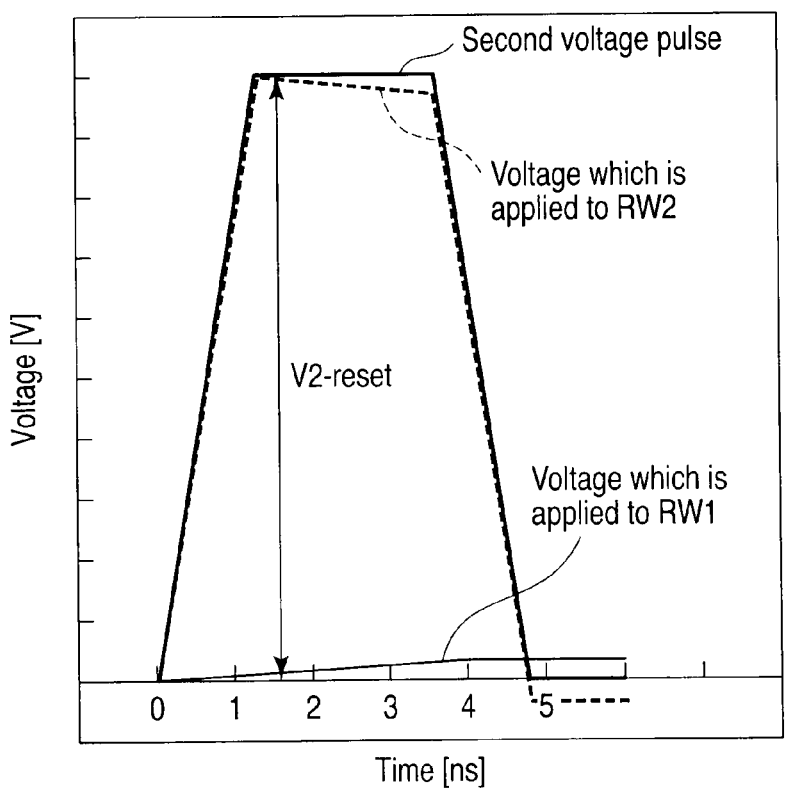
F I G. 48

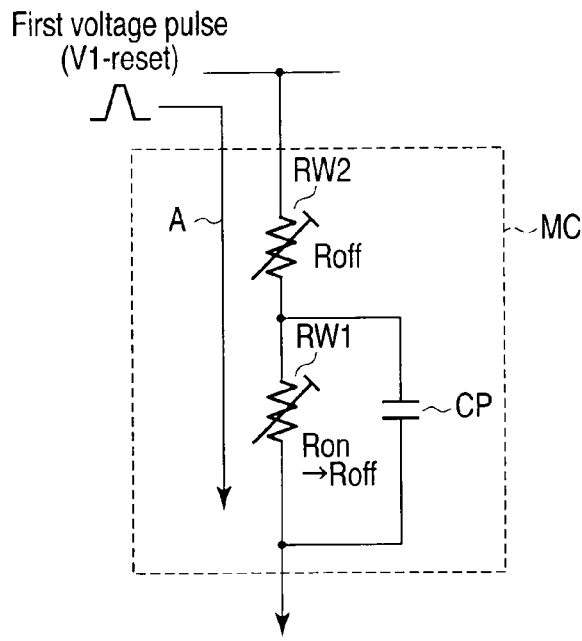
F I G. 49
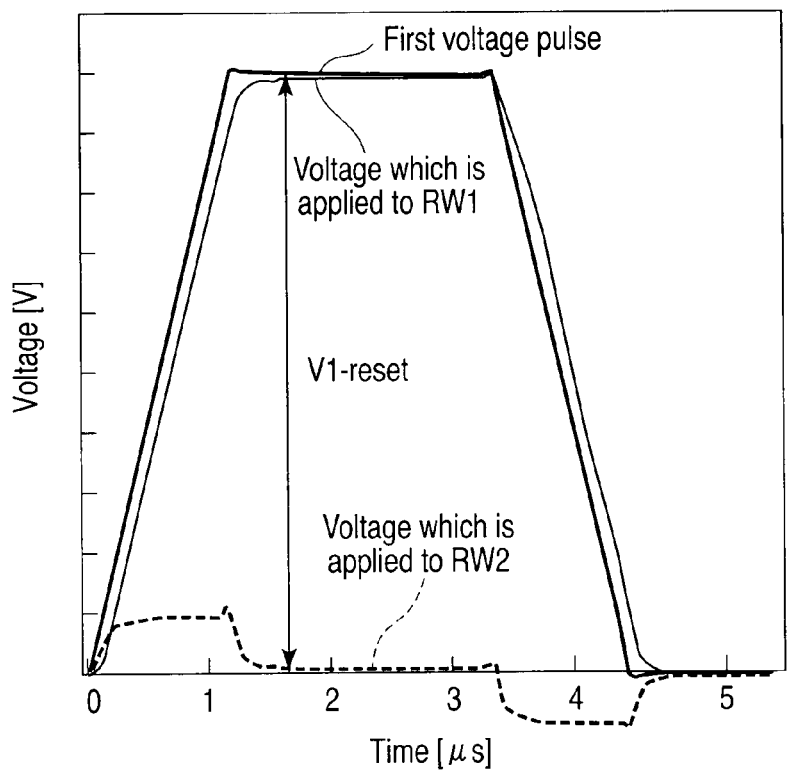
F I G. 50

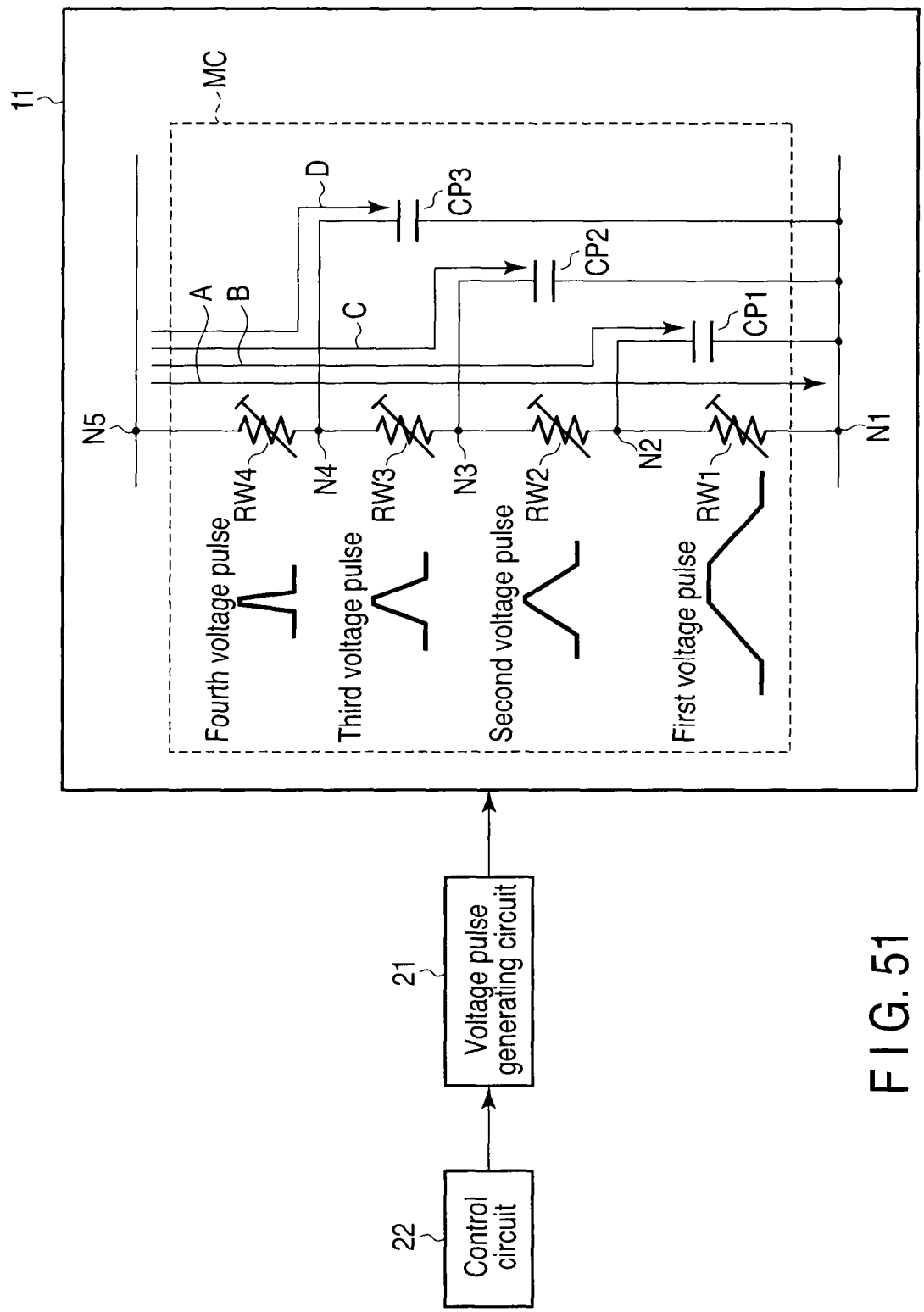
F I G. 51

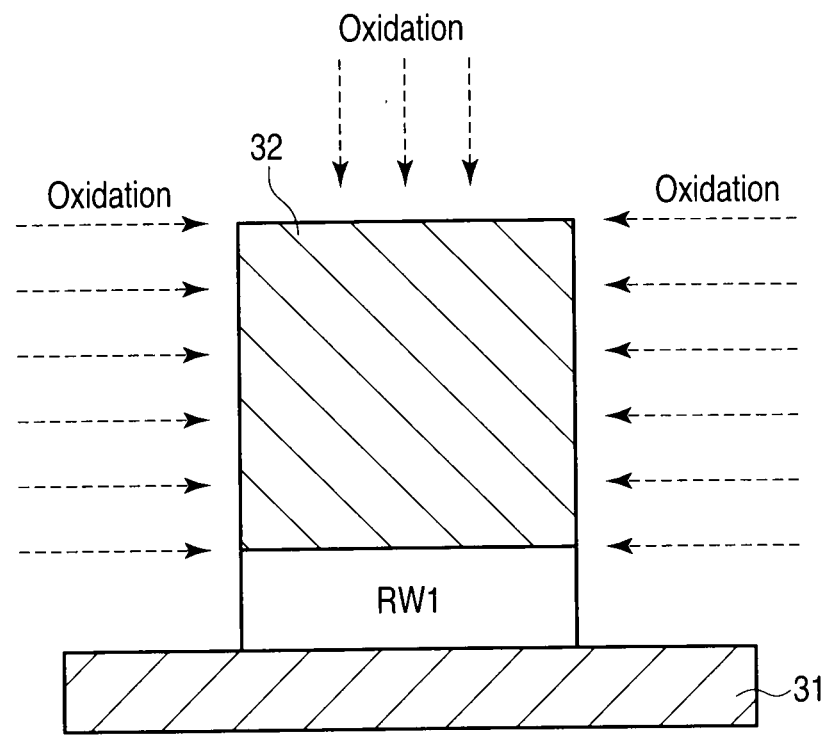
F I G. 54
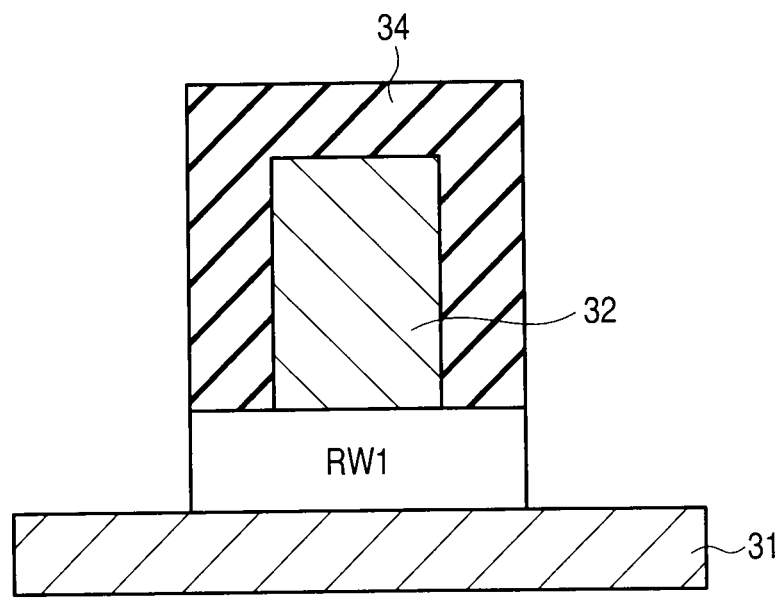
F I G. 55

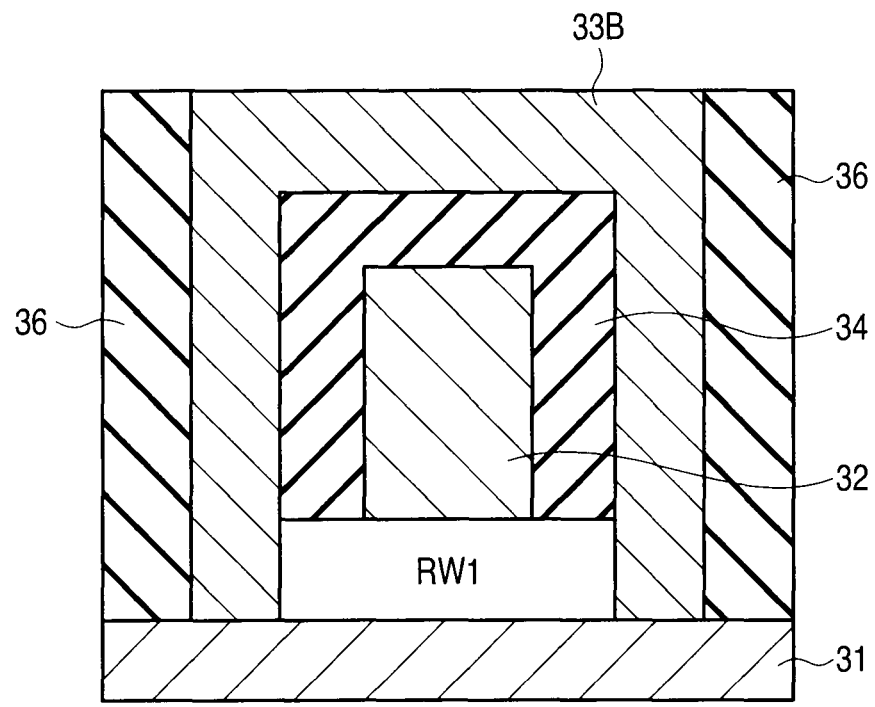
F I G. 58
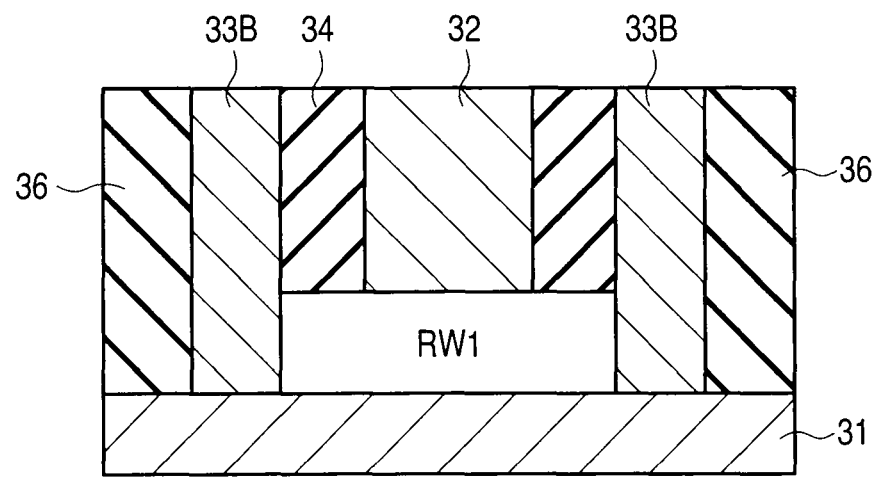
F I G. 59

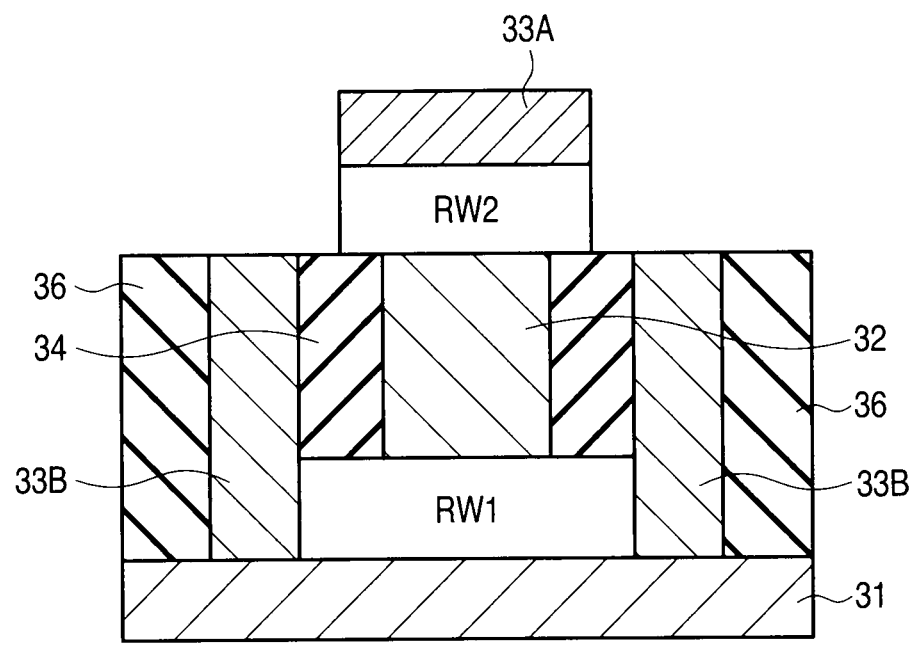
F I G. 60
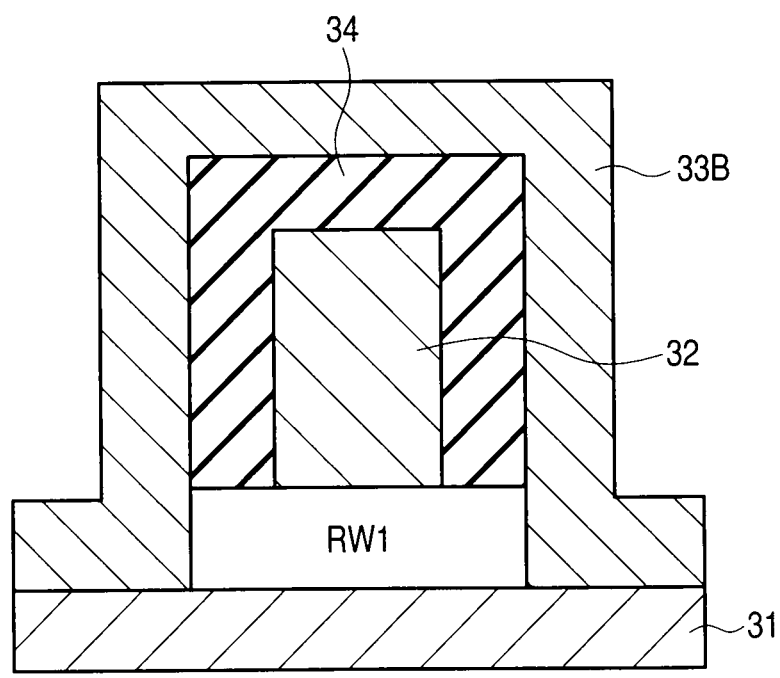
F I G. 61

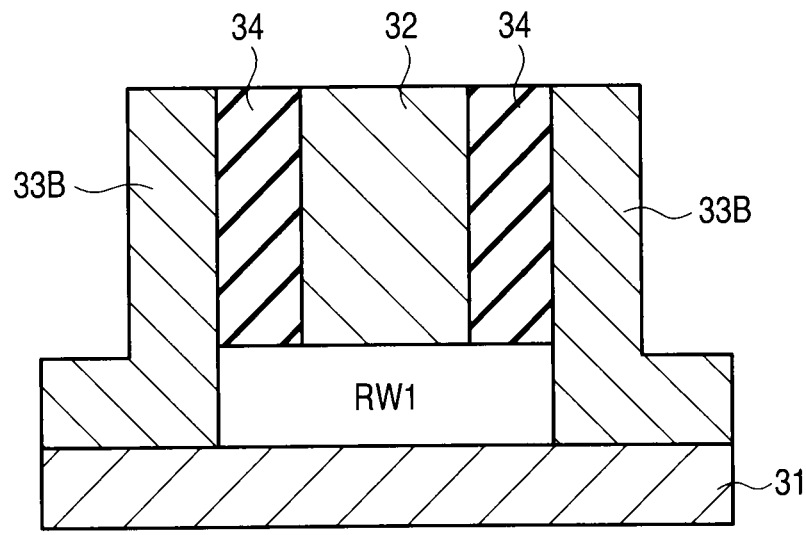
F I G. 62
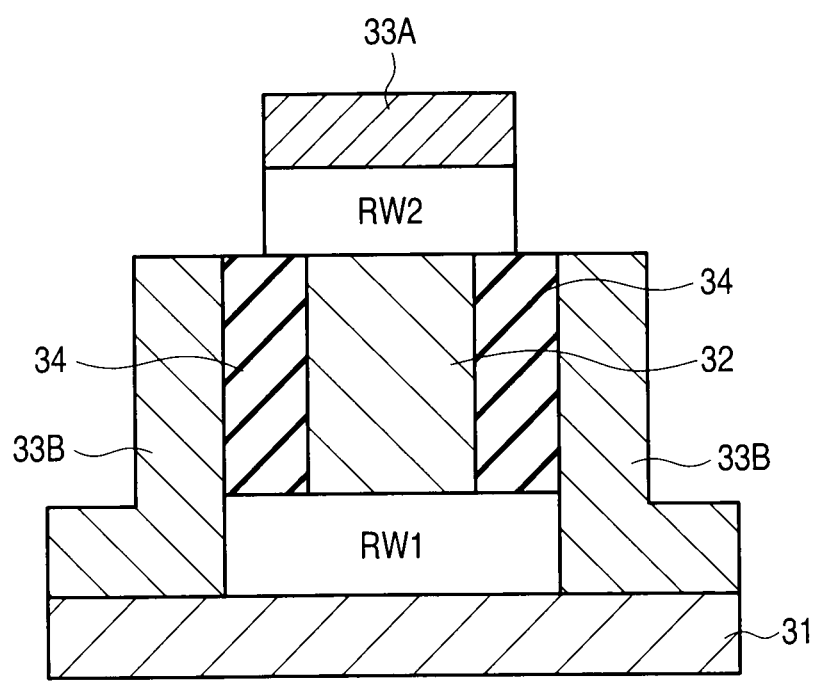
F I G. 63

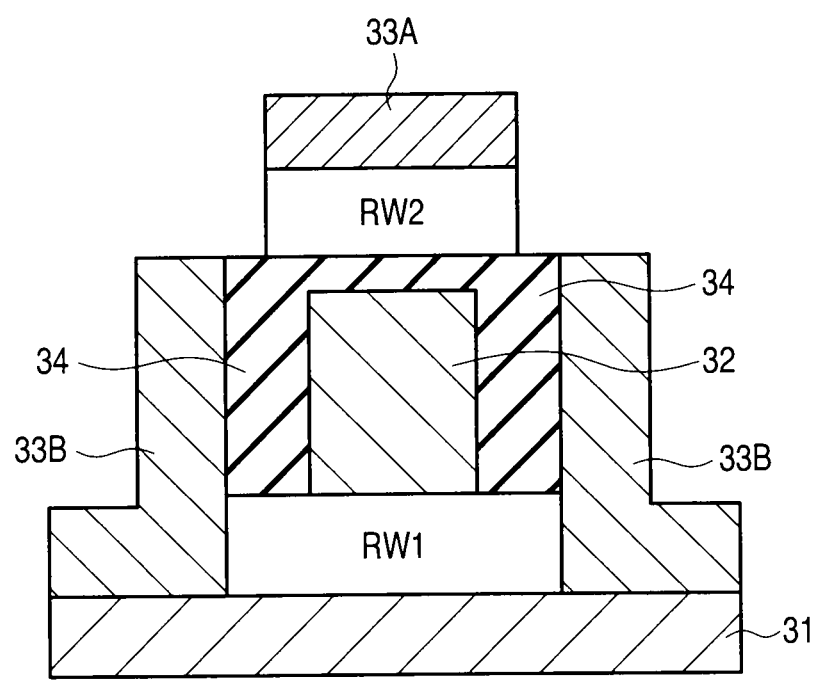
F I G. 64

MULTI-LEVEL RESISTANCE CHANGE MEMORY

CROSS-REFERENCE TO RELATED APPLICATIONS

This application is based upon and claims the benefit of priority from Japanese Patent Application No. 2010-207178, filed Sep. 15, 2010; the entire contents of which are incorporated herein by reference.

FIELD

Embodiments described herein relate generally to a multi-level resistance change memory.

BACKGROUND

Recently, along with the increasing integration of semiconductor devices, circuit patterns of transistors that comprise the semiconductor devices have been increasingly miniaturized. In response to thinning of wiring lines resulting from the miniaturization, there is a demand for techniques to improve the dimensional accuracy and positional accuracy of the circuit patterns. The field of semiconductor memories is no exception to such circumstances.

Semiconductor memories such as a DRAM, SRAM and flash memory that have been heretofore known and put on the market use a MOSFET as a memory cell. For such semiconductor memories, an improvement in dimensional accuracy at a rate higher than the rate of the miniaturization of the circuit patterns is demanded. Thus, a heavy burden is imposed on a photolithographic technique for forming micro circuit patterns, which is one of the factors of the rise in manufacturing costs.

A resistance change memory is drawing attention as a succeeding candidate memory to overcome the above-mentioned problem.

The resistance change memory is characterized in that an electric pulse is applied to change the resistance of a resistance change film and in that data is stored in the resistance change film in a nonvolatile manner. However, the resistance change memory is also limited in fact in miniaturization from the perspective of processing technologies. Therefore, from now on, there is a need for a technique to enhance integration without depending on miniaturization.

One of the techniques for realizing integration instead of miniaturization is to comprise a three-dimensional memory cell array. However, the three-dimensional memory cell array increases manufacturing costs due to an increase in the number of photo engraving processes (PEP). Moreover, due to an increase in the number of memory cell arrays to be stacked, the characteristics of the memory cell arrays are varied by the difference of process histories.

Accordingly, one technique for realizing integration instead of the miniaturization and three-dimensional configuration is to comprise a multi-level technique that stores three or more values in one memory cell. There are reported examples of applying the multi-level technique to the resistance change memory.

The resistance change memory can have a multi-level system when the resistance change film (memory cell) is capable of storing three or more resistances (three or more values). However, in this case, the resistance change film cannot have a great resistance variation, so that a sufficient margin is not allowed for the three or more resistances. As a result, high reliability is not ensured.

The resistance change memory can also have a multi-level configuration when resistance change films capable of storing, for example, two kinds of resistances (two values) are connected in series or parallel and each of the resistance change films has different two kinds of resistances. However, when the resistance change films are connected in series, such electrical characteristics are shown that a rate is determined by the resistance change film having the highest resistance. When the resistance change films are connected in parallel, such electrical characteristics are shown that a rate is determined by the resistance change film having the lowest resistance. Thus, it is difficult to control writing/erasing.

BRIEF DESCRIPTION OF THE DRAWINGS

FIG. 1 shows a circuitry of a multi-level resistance change memory.
FIG. 2 shows a device structure of the memory.
FIG. 3 shows a cross-sectional view along III-III line.
FIG. 10 shows a memory cell array.
FIG. 11 shows a device structure of the array.
FIG. 12 shows a cross-sectional view along XII-XII line.
FIG. 13 shows an example of a voltage pulse.
FIG. 14 shows a path of a first voltage pulse.
FIG. 15 shows a voltage applied to first and second resistance change films.
FIG. 16 shows a path of a second voltage pulse.
FIG. 18 shows a write operation.
FIG. 23 shows a path of a second voltage pulse.
FIG. 24 shows a voltage applied to first and second resistance change films.
FIG. 25 shows an erase operation.
FIG. 28 shows a path of a first voltage pulse.
FIG. 29 shows a voltage applied to first and second resistance change films.
FIG. 32 shows a read operation.
FIG. 38 shows paths of first and second voltage pulses.
FIG. 39 shows a write operation.
FIG. 42 shows a path of a first voltage pulse.
FIG. 43 shows a voltage applied to first and second resistance change films.
FIG. 44 shows a path of a first voltage pulse.

FIG. 45 shows a voltage applied to first and second resistance change films.

FIG. 46 shows an erase operation.

FIG. 47 shows a path of a second voltage pulse.

FIG. 48 shows a voltage applied to first and second resistance change films.

FIG. 49 shows a path of a first voltage pulse.

FIG. 50 shows a voltage applied to first and second resistance change films.

FIGS. 51 and 52 show a modification example of the memory.

FIGS. 53 to 64 show a modification example of the manufacturing method.

DETAILED DESCRIPTION

Figure 4:
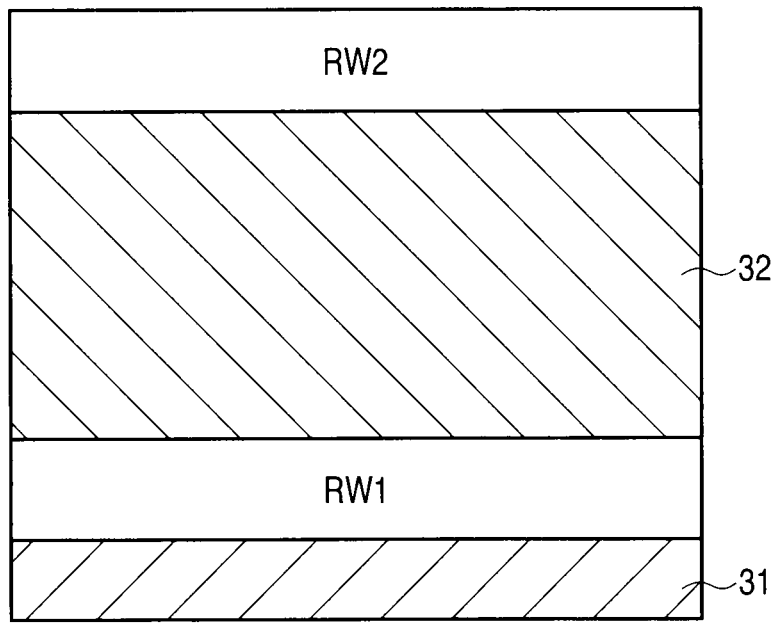
FIGS. 4 to 8 show a manufacturing method of the memory.

In general, according to one embodiment, a multi-level resistance change memory includes a memory cell comprising a first resistance change film, one end of the first resistance change film connected to a first node, and the other end of the first resistance change film connected to a second node; a second resistance change film, one end of the second resistance change film connected to a third node, and the other end of the second resistance change film connected to the second node; and a capacitor connected between the first and second nodes; a voltage pulse generating circuit generating a first voltage pulse with a first pulse width to divide a voltage of the first voltage pulse into the first and second resistance change films based on a resistance ratio thereof, and generating a second voltage pulse with a second pulse width shorter than the first pulse width to apply a voltage of the second voltage pulse to the second resistance change film by a transient response of the capacitor; and a control circuit which is stored multi-level data to the memory cell by using the first and second voltage pulses in a writing.

1. Basic Concept (1) Circuitry

FIG. 1 shows a circuitry of a multi-level resistance change memory.

Memory cell MC in memory cell array 11 comprises first and second resistance change films RW1 and RW2 connected in series, and capacitor CP connected in parallel to first resistance change film RW1. One end of first resistance change film RW1 is connected to first node N1, and the other end thereof is connected to second node N2. One end of second resistance change film RW2 is connected to third node N3, and the other end thereof is connected to second node N2. Capacitor CP is connected between first and second nodes N1 and N2.

Voltage pulse generating circuit 21 generates a first voltage pulse which passes through first path A including first and second resistance change films RW1 and RW2, and a second voltage pulse which passes through second path B including second resistance change film RW2 and capacitor CP.

When movement routes of the first and second voltage pulses are different, the first and second voltage pulses are characterized by having different waveforms.

For example, when a pulse width, a rise time and a fall time are defined as shown in FIG. 13, the different movement routes of the first and second voltage pulses are characterized in that the pulse width of the second voltage pulse is shorter than the rise time and fall time of the first voltage pulse.

Specifically, a pulse width of the first voltage pulse is larger than a product of a capacitance of capacitor CP and a resistance of second resistance change film RW2 before application of the first voltage pulse to memory cell MC, and a pulse width of the second voltage pulse is smaller than a product of a capacitance of capacitor CP and a resistance of second resistance change film RW2 before application of the second voltage pulse to memory cell MC.

Here, in FIG. 13, Twidth indicates the pulse width, Tedge indicates the rise time, and Ttrail indicates the fall time.

Control circuit 22 stores multi-level data in the memory cell by using the first and second voltage pulses in a writing.

For example, when each of first and second resistance change films RW1 and RW2 is capable of storing two kinds of resistances (two values), memory cell MC is capable of storing four values. In general, when each of first and second resistance change films RW1 and RW2 is capable of storing $2^n$ kinds of resistances ($2^n$ values), memory cell MC is capable of storing $2^{n \times 2}$ values. However, n is a natural number.

A specific write procedure will be explained in detail in the description of embodiments.

Thus, first path A including first and second resistance change films RW1 and RW2 and second path B including second resistance change film RW2 and capacitor CP are provided. Accordingly, it is possible to obtain a multi-level resistance change memory high in write control performance and high in reliability.

(2) Device Structure

FIG. 2 and FIG. 3 show a device structure of the memory cell of the multi-level resistance change memory. FIG. 2 is a plan view. FIG. 3 is a cross-sectional view along III-III line.

This device structure is one embodiment for obtaining the circuitry shown in FIG. 1.

First resistance change film RW1 is disposed on first electrode 31. First metal layer 32 is disposed on first resistance change film RW1. Second resistance change film RW2 is disposed on first metal layer 32. Second electrode 33A is disposed on second resistance change film RW2.

Insulating layer 34 covers a side surface of first metal layer 32. Second metal layer 33B contacts first electrode 31, and is opposite to the side surface of first metal layer 32 across insulating layer 34.

First metal layer 32, insulating layer 34 and second metal layer 33B constitute capacitor CP.

First resistance change film RW1, first metal layer 32, second resistance change film RW2, second electrode 33A and insulating layer 34 have a columnar shape as a whole in this example, but are not limited to this shape. For example, a prismatic shape is also allowable instead of the columnar shape.

Moreover, second metal layer 33B has a ring shape that surrounds a side surface of insulating layer 34, but is not limited to this shape. For example, second metal layer 33B may have a partially cut ring shape (C-shape).

Furthermore, the position of an upper end of second metal layer 33B is not specifically limited. However, second metal layer 33B has to be insulated from second resistance change film RW2 and second electrode 33A. Thus, for example, when the upper end of second metal layer 33B is higher than an upper end of first metal layer 32, it is preferable to add a new insulating film between second resistance change film RW2 and second metal layer 33B.

Still further, a new insulating film may be present between first resistance change film RW1 and second metal layer 33B.

(3) Manufacturing Method

A manufacturing method of the device structure shown in FIG. 2 and FIG. 3 is described.

First, as shown in FIG. 4, a stack structure comprising first resistance change film RW1, first metal layer 32 and second resistance change film RW2 is formed on first electrode 31.

First and second resistance change films RW1 and RW2 may be made of the same material or different materials.

Here, the characteristic point is that first and second resistance change films RW1 and RW2 may be made of the same material.

In this case, first and second resistance change films RW1 and RW2 have the same $2^n$ kinds of resistances ($2^n$ values). However, as described above, an electric pulse selectively passes through one of the two paths in a writing. Therefore, write control performance and reliability do not deteriorate.

First and second resistance change films RW1 and RW2 are made of a metal oxide such as $HfO_x$ (0<x). $HfO_x$ can be formed by, for example, a CVD method, ALD method or sputtering method. First metal layer 32 is made of a metal such as Ti.

Figure 5:
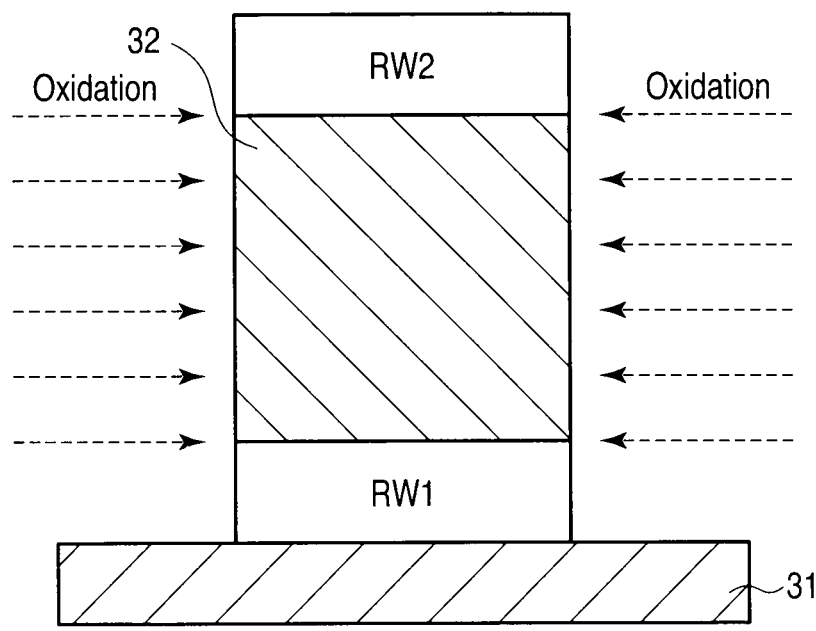

Furthermore, as shown in FIG. 5, a photomask is formed by the PEP. This photomask is used as a mask to pattern the stack structure comprising first resistance change film RW1, first metal layer 32 and second resistance change film RW2 by anisotropic etching such as RIE.

Figure 6:
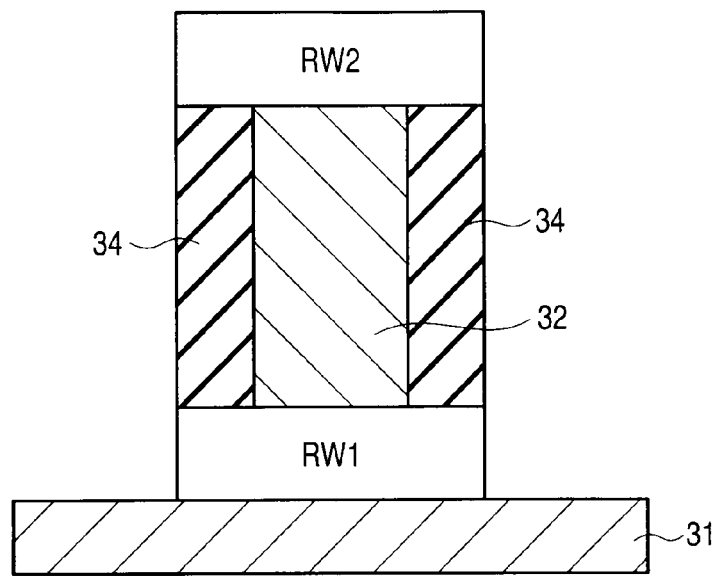

Subsequently, the side surface of first metal layer 32 is oxidized, and insulating layer 34 is formed on the side surface of first metal layer 32 as shown in FIG. 6. Here, when first metal layer 32 is made of Ti, insulating layer 34 is $TiO_x$ (0<x).

This oxidation may be simultaneous with or separate from the removal (ashing) of the photomask.

Figure 7:
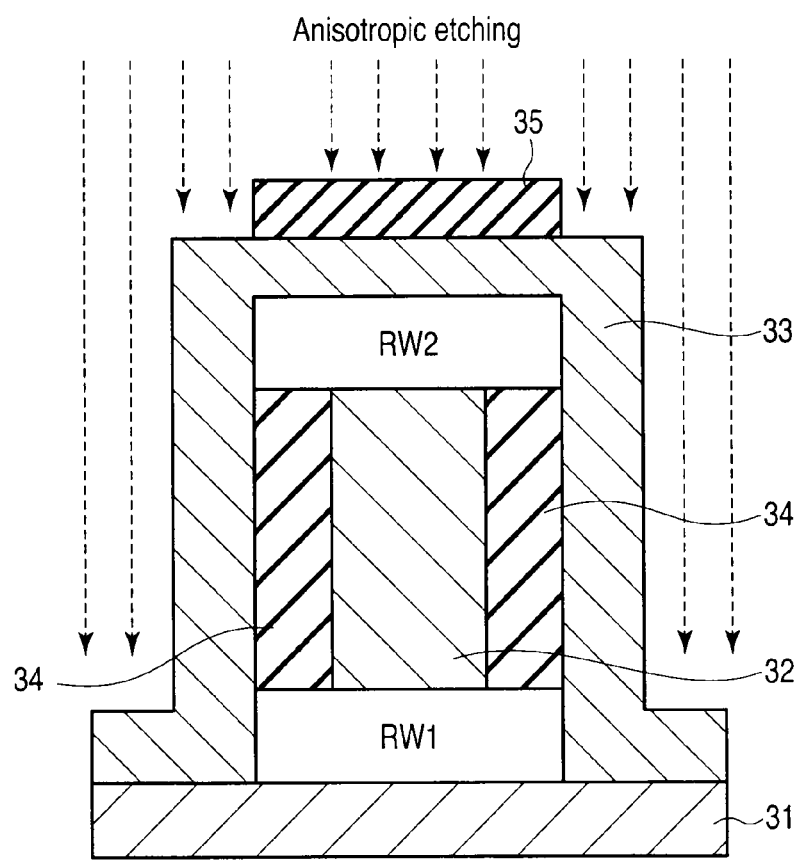

Furthermore, as shown in FIG. 7, metal layer 33 covering the patterned stack structure is formed on first electrode 31. Metal layer 33 is made of, for example, $TiN_x$ (0<x).

Moreover, photomask 35 is formed on metal layer 33 by the PEP. Photomask 35 is used as a mask to etch metal layer 33 by anisotropic etching such as RIE. The planar size (size viewed from above) of photomask 35 is the same as or slightly smaller than the planar size of second resistance change film RW2.

Figure 8:
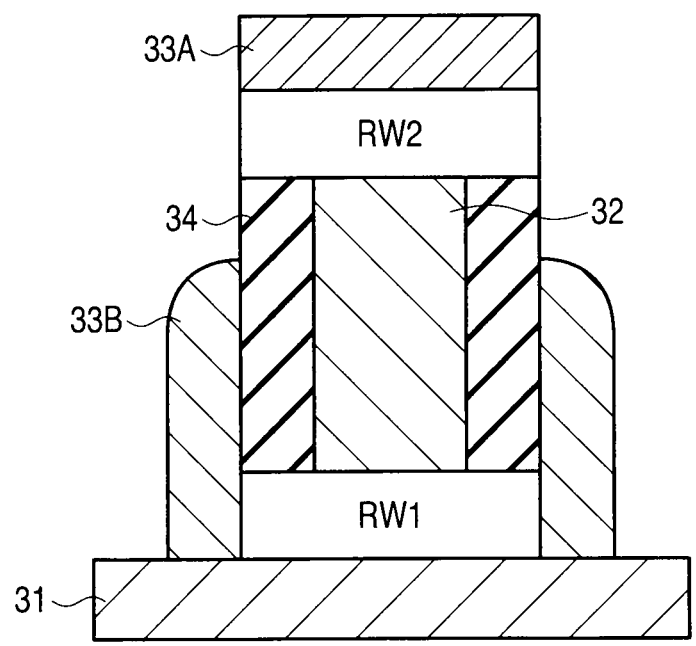

As a result, as shown in FIG. 8, second electrode 33A is formed on second resistance change film RW2, and second metal layer 33B opposite to the side surface of first metal layer 32 across insulating layer 34 is formed on first electrode 31.

Through the process described above, the device structure shown in FIG. 2 and FIG. 3 is completed.

(4) Application Example

Figure 9:
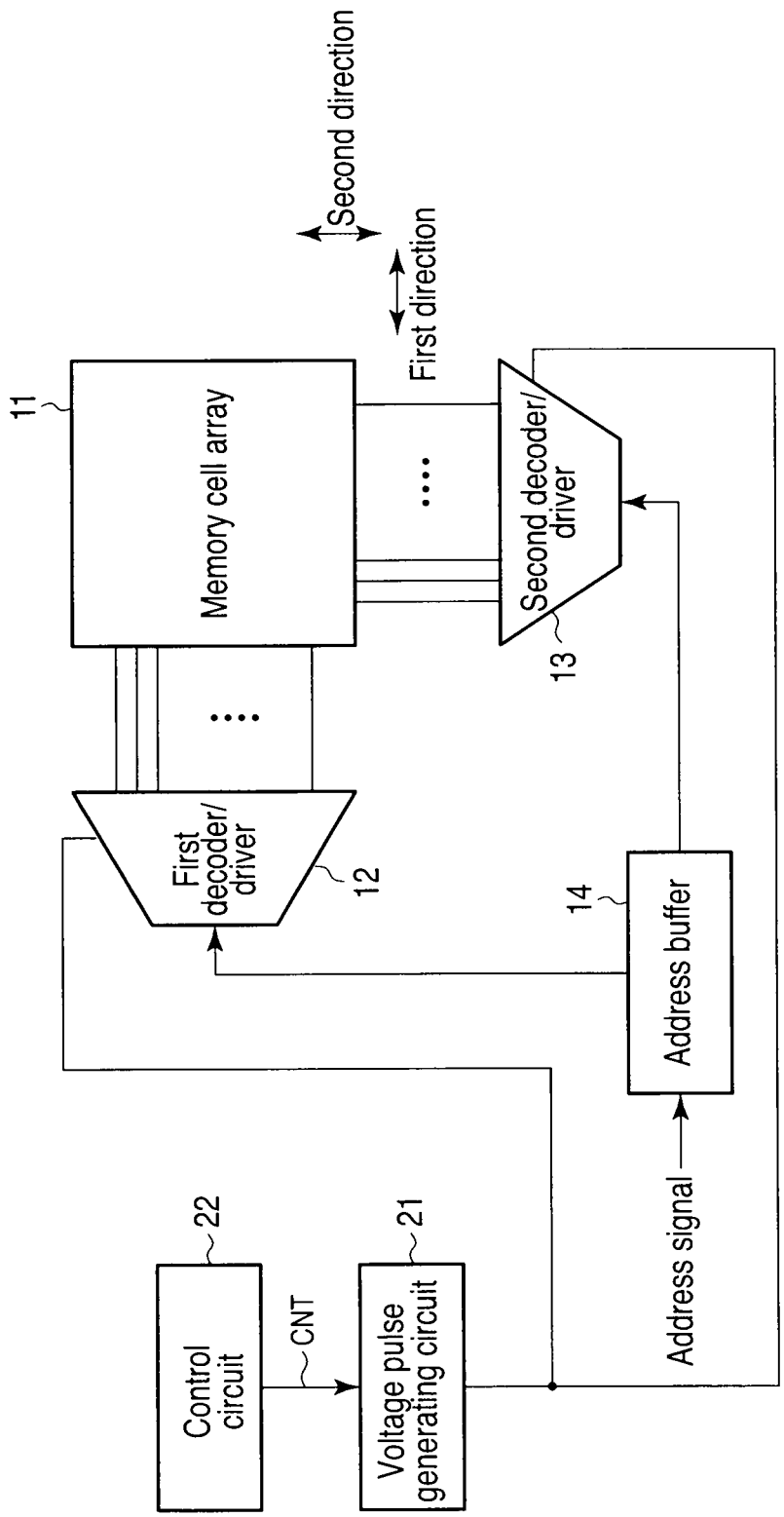
FIG. 9 shows an application example of the memory.

FIG. 9 shows an application example of the multi-level resistance change memory.

Memory cell array 11 includes the memory cells shown in FIG. 2 and FIG. 3. First decoder/driver 12 is disposed on one end of memory cell array 11 in a first direction. Second decoder/driver 13 is disposed on one end of memory cell array 11 in a second direction.

An address signal is input to first and second decoders/drivers 12 and 13 via address buffer 14. First decoder/driver 12 selects, for example, one of rows of memory cell array 11 in accordance with the address signal. Second decoder/driver 13 selects, for example, one of columns of memory cell array 11 in accordance with the address signal.

Voltage pulse generating circuit 21 and control circuit 22 correspond to voltage pulse generating circuit 21 and control circuit 22 shown in FIG. 1.

Voltage pulse generating circuit 21 can generate voltage pulses having different waveforms in a reading/writing. Voltage pulse generating circuit 21 includes a voltage pulse shaping circuit for generating these voltage pulses.

In a reading/writing, control circuit 22 selects two or more of the voltage pulses that can be generated in voltage pulse generating circuit 21, and uses the selected two or more voltage pulses to read/write multi-level data from/into the memory cell.

FIG. 10 shows a configuration example of the memory cell array.

Memory cell array 11 is a cross point type in which memory cells MC are disposed at intersections of lower bit lines LBL1 and LBL2 extending in the first direction and upper bit lines UBL1 and UBL2 extending in the second direction.

Although four memory cells (two rows and two columns) MC are shown in this example for simplification of explanation, there are actually more memory cells.

Field effect transistors (FETs) as drivers D are connected to ends in the first direction of lower bit lines LBL1 and LBL2. And field effect transistors (FETs) as drivers D are connected to ends in the second direction of upper bit lines UBL1 and UBL2. These FETs are switched on/off under the control of signals coming from the decoders.

FIG. 11 is a plan view of the memory cell array shown in FIG. 10 in a device form. FIG. 12 is a cross-sectional view along XII-XII line in FIG. 11.

Lower bit lines LBL1 and LBL2 are formed by a line-and-space pattern having a regular pitch F2 (F is, e.g., a future size) dependent on the generation of LSI. Upper bit lines UBL1 and UBL2 are also formed by a line-and-space pattern having a regular pitch F2.

Although first electrode 31 serves as lower bit lines LBL1 and LBL2 in this example, new lower bit lines LBL1 and LBL2 may be provided in addition to first electrode 31. Similarly, although second electrode 33A serves as upper bit lines UBL1 and UBL2, new upper bit lines UBL1 and UBL2 may be provided in addition to second electrode 33A.

Suppose here that the stack structure comprising first and second resistance change films RW1 and RW2, first metal layer 32 and insulating layer 34 has a columnar shape. For example, each of the widths of first metal layer 32 in the first and second directions is W1. Each of the widths of insulating layer 34 in the first and second directions and each of the widths of second metal layer 33B in the first and second directions are W2.

The distance between second metal layers 33B of adjacent two memory cells MC is W3 (=F−2W2).

Moreover, the width of first metal layer 32 in a third direction (height direction) is H1, and the width of a part where first metal layer 32 faces second metal layers 33B in the third direction is H2.

2. Embodiments

The embodiments for obtaining a highly reliable resistance change memory that allows multi-level data to be written into the memory cell with high control performance are described below.

(1) Conditions of Voltage Pulses

For writing (set), erasing (reset) and reading, at least two voltage pulses are used, that is, the first voltage pulse which passes through first path A shown in FIG. 1 and the second voltage pulse which passes through second path B shown in FIG. 1 are used.

Conditions of the voltage pulses are first described.

FIG. 14 shows a movement path of the first voltage pulse.

In order for the first voltage pulse to pass through first path A, pulse width Twidth1 (unit=[sec]) of the first voltage pulse has only to be larger than a product of capacitance C (unit=[F]) of capacitor CP and resistance R (unit=[Ω]) of second resistance change film RW2 before application of the first voltage pulse to memory cell MC.

For example, pulse width Twidth1 of the first voltage pulse is more than 30 times as large as a product (=C×Roff) of capacitance C of capacitor CP and maximum value Roff of the resistance of second resistance change film RW2 before application of the first voltage pulse to the memory cell. Here, a margin of 30 times is given to allow a sufficient time for steadily applying desired voltages to RW1 and RW2 and to avoid unnecessary voltage stress on second resistance change film RW2. As shown in FIG. 13, Tedge and Ttrail are always smaller than Twidth. When Tedge and Ttrail are short, a high voltage is temporarily applied at the rise and fall of the pulse. Regarding this phenomenon, if Tedge and Ttrail are 10 times as large as C×Roff, an overvoltage temporarily applied to RW2 at the rise and fall of the pulse can be reduced to such a degree that does not affect the characteristics of RW2. For example, if Twidth=3×Tedge(=Ttrail), Twidth has only to be 30 times as large as C×Roff. In this case, a high voltage necessary for writing is distributed and applied to both first and second resistance change films RW1 and RW2.

FIG. 15 shows the relation between the first voltage pulse satisfying Twidth>C×Roff and voltages applied to the first and second resistance change films.

It is appreciated from FIG. 15 that voltages are applied to first and second resistance change films RW1 and RW2 when the first voltage pulse is applied to the memory cell. The reason is that the pulse width of the first voltage pulse is sufficiently large as compared with a CR delay and the first voltage pulse therefore escapes to a ground point via the first and second resistance change films (first path). Moreover, Tedge and Ttrail of the first voltage pulse are also sufficiently large as compared with the CR delay, and no overvoltage is therefore applied to RW2 at the rise and fall of the pulse.

Here, suppose in FIG. 15 that the resistances of first and second resistance change films RW1 and RW2 before the application of the first voltage pulse to memory cell are equal to each other.

Thus, the pulse width of the first voltage pulse is smaller than the product of the capacitance of capacitor and the resistance of the second resistance change film before the application of the first voltage pulse to memory cell, such that the first voltage pulse can be applied to both of the first and second resistance change films to control writing.

FIG. 16 shows a movement path of the second voltage pulse.

In order for the second voltage pulse to pass through second path B, pulse width Twidth2 (unit=[sec]) of the second voltage pulse has only to be smaller than a product of capacitance C (unit=[F]) of capacitor CP and resistance R (unit=[Ω]) of second resistance change film RW2 before application of the second voltage pulse to memory cell MC.

For example, pulse width Twidth2 of the second voltage pulse is more than 0.3 times as small as a product (=C×Ron) of capacitance C of capacitor CP and minimum value Ron of the resistance of second resistance change film RW2 before application of the second voltage pulse to memory cell. Here, a margin of 0.3 times is given so that a high voltage necessary for writing may be applied to second resistance change film RW2 and may not be applied to first resistance change film RW1. For example, if Tedge is sufficiently short, a voltage can be applied to RW2 alone at the rise of the pulse. However, if the pulse width is large, distributed voltages are steadily applied to RW1 and RW2, and unnecessary stress is placed on RW1. That is, in order to apply the voltage pulse to RW2 alone, both the pulse rise/fall times and the pulse width have to be sufficiently small as compared with C×Ron. Here, since the rise/fall times≦the pulse width, the pulse width has only to be sufficiently small as compared with C×Ron. If the pulse width<C×Ron×0.3, the voltage unnecessarily applied to RW1 can be sufficiently reduced to such a degree that does not affect element characteristics.

Figure 17:
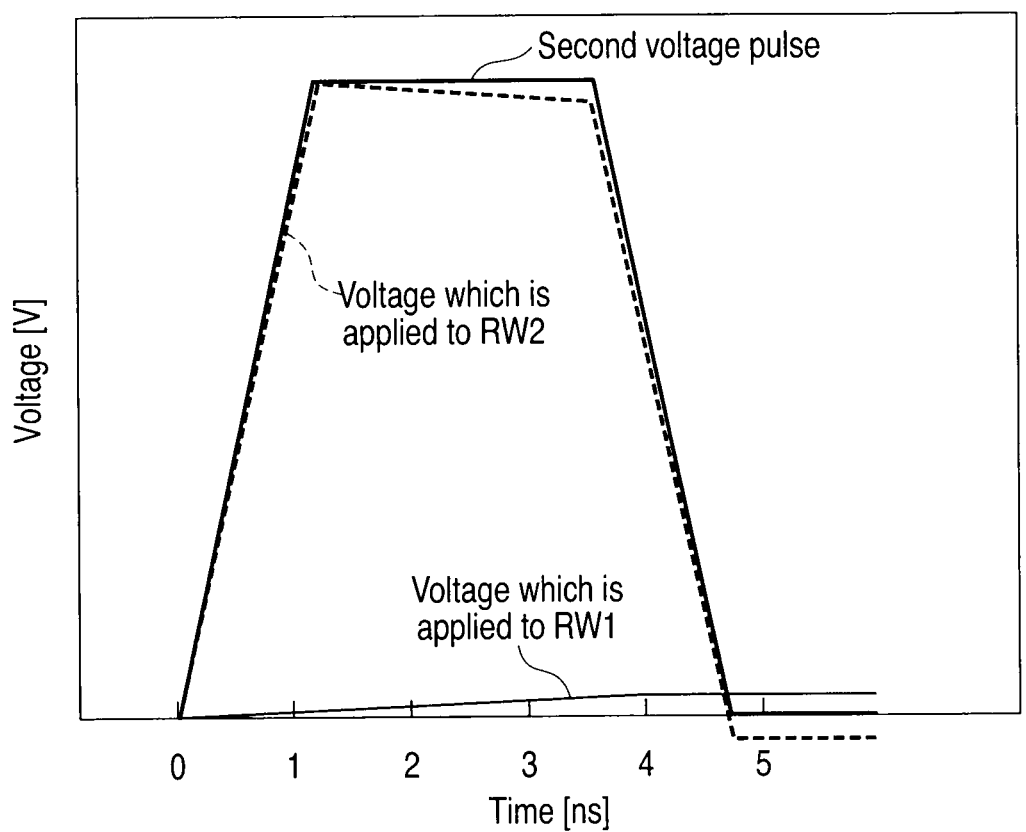
FIG. 17 shows a voltage applied to first and second resistance change films.

FIG. 17 shows the relation between the second voltage pulse and voltages applied to the first and second resistance change films.

It is appreciated from FIG. 17 that almost no voltage is applied to first resistance change film RW1 when the second voltage pulse having a pulse width 0.3 times as small as C×Ron is applied to the memory cell. The reason is that the pulse width of the second voltage pulse is sufficiently small as compared with a CR delay, so that the capacitor is not sufficiently charged and the second voltage pulse escapes to the ground point via the second resistance change film and the capacitor (second path).

Thus, the pulse width of the second voltage pulse is smaller than a product of the capacitance of the capacitor and the resistance of second resistance change film before the application of the second voltage pulse to memory cell, such that the second voltage pulse can be applied to the second resistance change film alone to control writing.

(2) First Embodiment

According to the first embodiment, each of the first and second resistance change films stores two values, and two resistance states (high resistance/low resistance) of the first resistance change film are the same as two resistance states (high resistance/low resistance) of the second resistance change film.

Multi-level data write (set)/erase (reset)/read operations are described below. Although an erase state is set to high resistance in the example described below, the erase state may be set to low resistance. In this case, write can be read for erase and erase can be read for write in the following explanation when necessary.

A. Write (Set)/Erase (Reset) Operations

FIG. 18 shows the write operation. FIG. 25 shows the erase operation.

Since each of first and second resistance change films RW1 and RW2 is capable of storing two values, the memory cell can take one of four kinds of states A, B, C and D. Here, the D-state is a reset state "00". In the D-state, the resistance of each of first and second resistance change films RW1 and RW2 is at high resistance.

Here, a write operation from the D-state (initial state) to the A-state, B-state or C-state, and an erase operation from the A-state, B-state, C-state or D-state to the D-state are described. The waveforms of the first and second voltage pulses comply with the definition in FIG. 13 and satisfy the conditions of the above-mentioned voltage pulses.

That is, $$\text{First voltage pulse: } T\text{width}1 > 30 \times C \times R\text{off} \tag{1}$$

$$\text{Second voltage pulse: } T\text{width}2 < 0.3 \times C \times R\text{on} \tag{2}$$

In this example, the amplitudes of the first and second voltage pulses are not specifically limited, and can be changed suitably for the characteristics of first and second resistance change films RW1 and RW2.

Here, for example, in FIG. 12, a half pitch (corresponding to F) is 12 [nm], first and second resistance change films RW1 and RW2 are made of $HfO_x$, low resistance state Ron of first and second resistance change films RW1 and RW2 is 7 [MΩ], high resistance state Roff is 70 [MΩ], and capacitance C of capacitor CP is $1.7 \times 10^{-16}$ [F].

In this case, in accordance with Expression (1) and Expression (2), conditions of the first and second voltage pulses are, for example, First voltage pulse: $T\text{width}1 > 3.5$ [μs]  (3)

Second voltage pulse: $T\text{width}2 < 3.5$ [ns]  (4).

A.-1. Write (Set) Operation

In the write (set) operation, for example, one voltage (amplitude) of the first voltage pulse is used, and two voltages (amplitudes) of the second voltage pulse are used.

When first and second resistance change films RW1 and RW2 have the same resistance state (high resistance state Roff), the first voltage pulse has voltage V1-set that changes the resistance states of first and second resistance change films RW1 and RW2 from high resistance state Roff to low resistance state Ron.

The second voltage pulse has voltage V2-set that changes the resistance state of second resistance change film RW2 from high resistance state Roff to low resistance state Ron or voltage V2-reset that changes the resistance state of second resistance change film RW2 from low resistance state Ron to high resistance state Roff.

The first voltage pulse and the second voltage pulse having V2-set are referred to as set pulses. The second voltage pulse having V2-reset is referred to as a reset pulse.

This example is based on the assumption that the moving directions (polar characters) of the first and second voltage pulses are the same. However, if, for example, the second voltage pulse is movable in two directions (changeable in polar character), a write operation can be performed on the assumption that V2-set=V2-reset.

Writing from D-State to A-State

Figure 19:
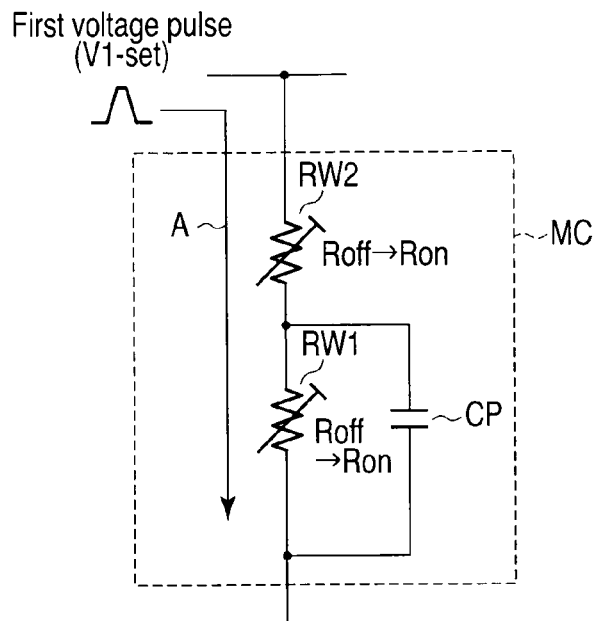
FIG. 19 shows a path of a first voltage pulse.
Figure 20:
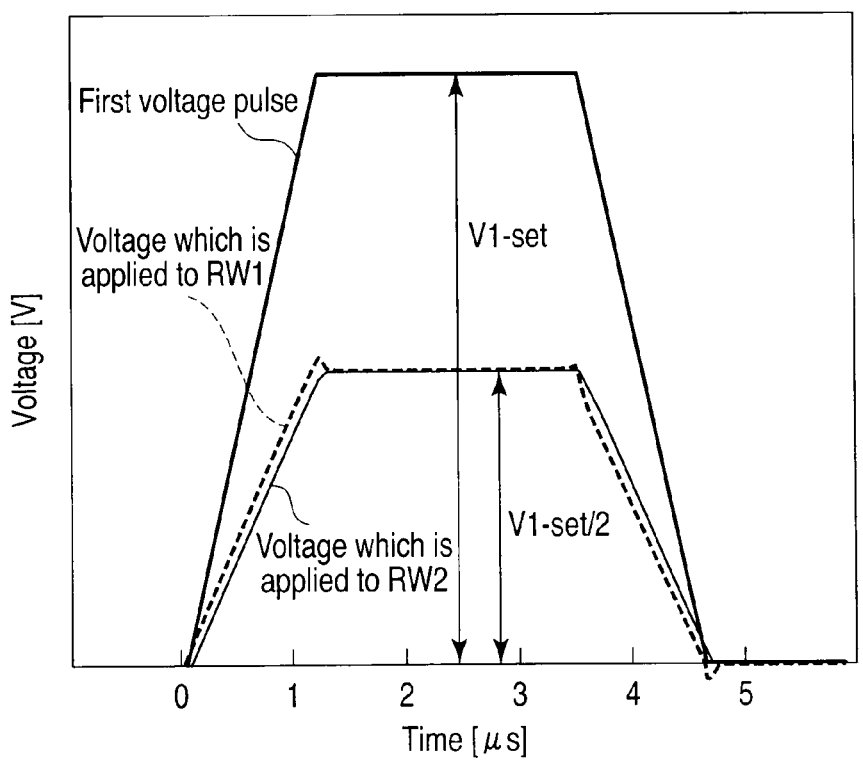
FIG. 20 shows a voltage applied to first and second resistance change films.

As shown in FIG. 18, the first voltage pulse (set pulse) having voltage V1-set has only to be applied to the memory cell. At the same time, the first voltage pulse passes through first path A, as shown in FIG. 19 and FIG. 20.

Thus, voltage V1-set/2 is applied to each of first and second resistance change films (both having Roff) RW1 and RW2. Voltage V1-set/2 is greater than a threshold that changes the resistance from high resistance state Roff to low resistance state Ron.

Therefore, the use of the first voltage pulse enables the writing from the D-state to the A-state.

Writing from D-State to B-State

Figure 21:
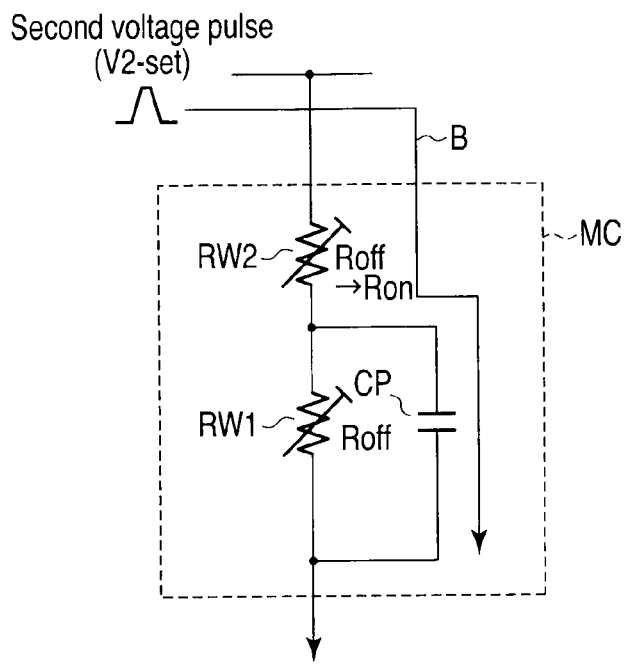
FIG. 21 shows a path of a second voltage pulse.
Figure 22:
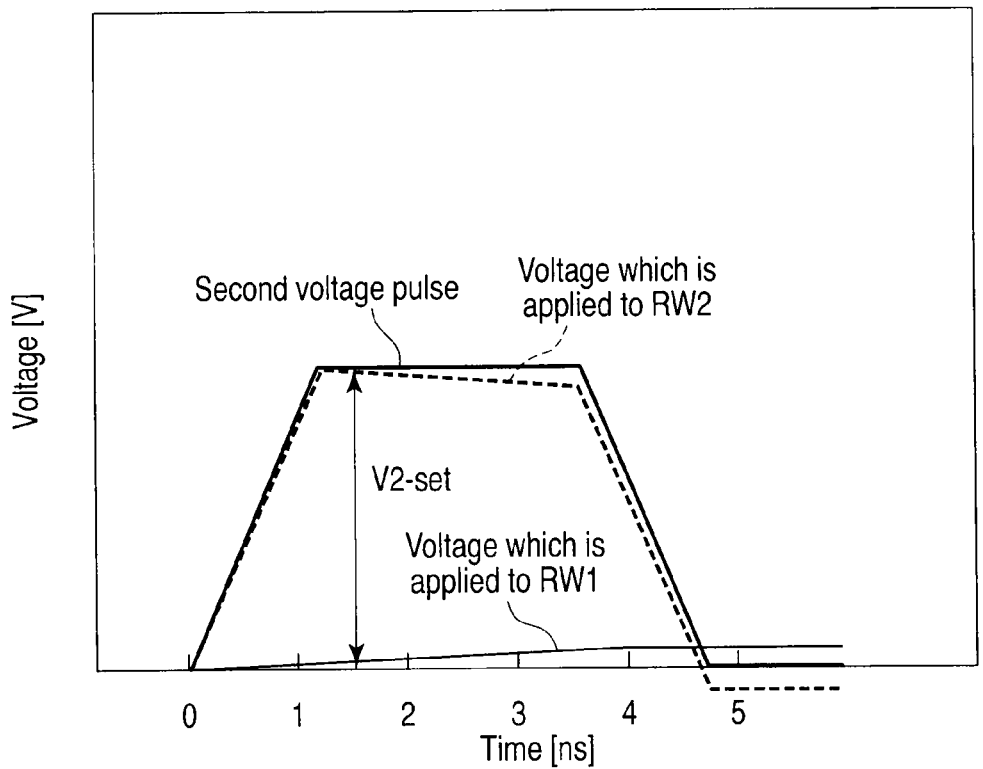
FIG. 22 shows a voltage applied to first and second resistance change films.

As shown in FIG. 18, the second voltage pulse (set pulse) having voltage V2-set has only to be applied to the memory cell. At the same time, the second voltage pulse passes through second path B, as shown in FIG. 21 and FIG. 22.

Thus, voltage V2-set is applied to second resistance change film (Roff) RW2. V2-set is greater than a threshold that changes the resistance from high resistance state Roff to low resistance state Ron.

Therefore, the use of the second voltage pulse having V2-set enables the writing from the D-state to the B-state.

Writing from D-State to C-State

As shown in FIG. 18, the first voltage pulse (set pulse) having voltage V1-set is first applied to the memory cell. At the same time, the above-mentioned writing into the A-state is performed, and both the resistances of first and second resistance change films RW1 and RW2 change from high resistance Roff to low resistance Ron.

Subsequently, the second voltage pulse (reset pulse) having voltage V2-reset is applied to the memory cell. At the same time, the second voltage pulse passes through second path B, as shown in FIG. 23 and FIG. 24.

Thus, voltage V2-reset is applied to second resistance change film (Ron) RW2. V2-reset is greater than a threshold that changes the resistance from low resistance state Ron to high resistance state Roff.

Therefore, the use of the first voltage pulse and the second voltage pulse having V2-reset enables the writing from the D-state to the C-state.

The write operation described above is characterized in that even if first and second resistance change films RW1 and RW2 have the same two resistance states (high resistance state/low resistance state), first and second paths A and B are provided to independently change the resistance state of each resistance change film so that multi-level data can be written.

According to conventional techniques, when the first and second resistance change films have the same two resistance states, changing the resistance state of one resistance change film causes the resistance state of the other resistance change film to be also changed. Therefore, the state of each resistance change film cannot be independently changed, and multi-level data cannot be written. Moreover, even if each of the first and second resistance change films has different two resistance states to increase values, write control performance cannot be enhanced because there is only one voltage pulse path (because the voltage pulses are always applied to the first and second resistance change films).

However, in this example, each of first and second resistance change films RW1 and RW2 can have different two resistance states (high resistance/low resistance).

A.-2. Erase (Reset) Operation

The erase operation is performed, for example, by simultaneously erasing all the memory cells in different states A to C. In such an erase operation, for example, two voltages (amplitudes) of the first voltage pulse are used, and one voltage (amplitude) of the second voltage pulse is used.

When first resistance change film RW1 is at high resistance Roff and second resistance change film RW2 is at low resistance Ron, the first voltage pulse has voltage V1-set that changes the resistance state of first resistance change film RW1 from high resistance state Roff to low resistance state Ron. Alternatively, when first and second resistance change films RW1 and RW2 have the same resistance state (low resistance Ron), the first voltage pulse has voltage V1-reset that changes the resistance states of first and second resistance change films RW1 and RW2 from low resistance state Ron to high resistance state Roff.

The second voltage pulse has voltage V2-set that changes the resistance state of second resistance change film RW2 from high resistance Roff to low resistance Ron.

The first voltage pulse having V1-set and the second voltage pulse are referred to as set pulses. The first voltage pulse having V1-reset is referred to as a reset pulse.

This example is based on the assumption that the moving directions (polar characters) of the first and second voltage pulses are the same. However, for example, the first voltage pulse can be moved in two directions (changeable in polar character) to perform an erase operation.

All of the erasing from the A-state, B-state, C-state and D-state to the D-state can be performed by the same operation.

Erasing from A-State to D-State

As shown in FIG. 25, the second voltage pulse (set pulse) having voltage V2-set is first applied to the memory cell. However, since the resistance state of second resistance change film RW2 is already Ron, this state does not change.

Furthermore, the first voltage pulse (set pulse) having voltage V1-set is applied to the memory cell. However, since both the resistance states of first and second resistance change films RW1 and RW2 are Ron, this state does not change.

Figure 26:
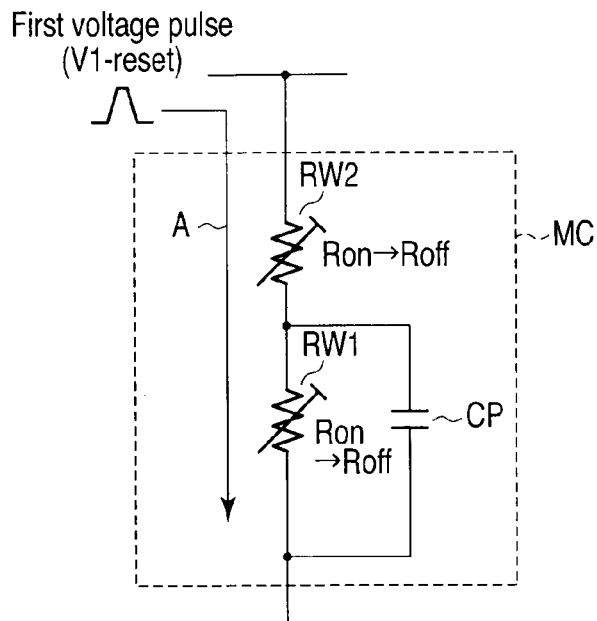
FIG. 26 shows a path of a first voltage pulse.
Figure 27:
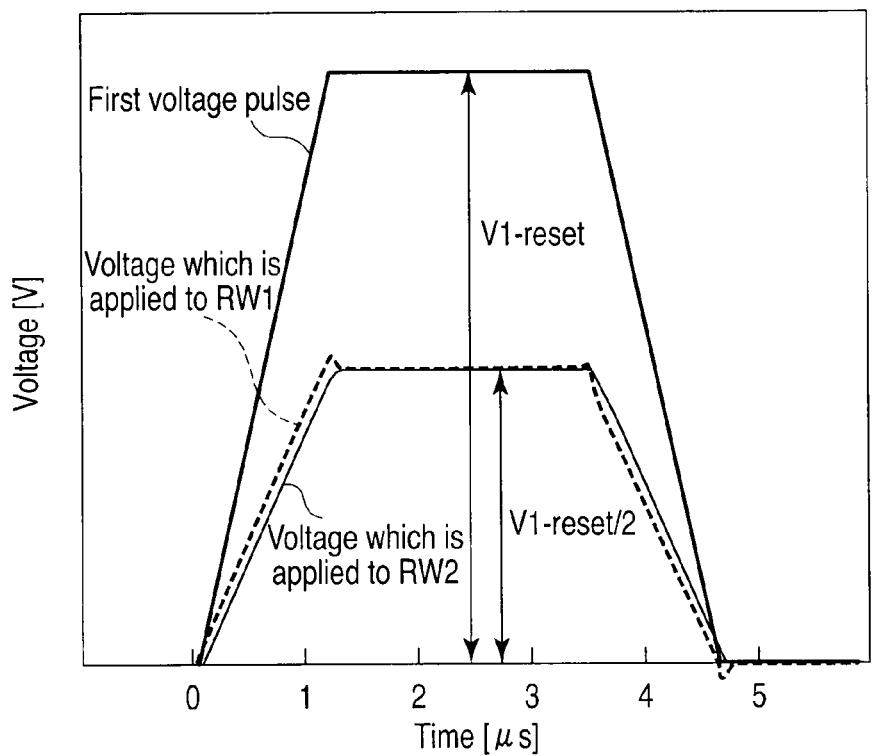
FIG. 27 shows a voltage applied to first and second resistance change films.

Subsequently, the first voltage pulse (reset pulse) having voltage V1-reset is applied to the memory cell. At the same time, the first voltage pulse passes through first path A, as shown in FIG. 26 and FIG. 27.

Thus, voltage V1-reset/2 is applied to each of first and second resistance change films (both having Ron) RW1 and RW2. V1-reset/2 is greater than a threshold that changes the resistance from low resistance state Ron to high resistance state Roff.

Therefore, the use of the first voltage pulses having voltages V1-set and V1-reset and the second voltage pulse having voltage V2-set enables the erasing from the A-state to the D-state.

Erasing from B-State to D-State

As shown in FIG. 25, the second voltage pulse (set pulse) having voltage V2-set is first applied to the memory cell. However, since the resistance state of second resistance change film RW2 is already Ron, this state does not change.

Furthermore, the first voltage pulse (set pulse) having voltage V1-set is applied to the memory cell. At the same time, the first voltage pulse passes through first path A, as shown in FIG. 28 and FIG. 29.

Moreover, the resistance state of first resistance change film RW1 is Roff, and the resistance state of second resistance change film RW2 is Ron. Here, voltage V1-set (RW1) applied to first resistance change film RW1 is greater than a threshold that changes the resistance from high resistance state Roff to low resistance state Ron and smaller than a threshold that changes the resistance from low resistance state Ron to high resistance state Roff. Thus, the resistance of first resistance change film RW1 changes from high resistance Roff to low resistance Ron.

At this point, first and second resistance change films RW1 and RW2 are brought (unified) to the A-state.

Subsequently, the first voltage pulse (reset pulse) having voltage V1-reset is applied to the memory cell. At the same time, the first voltage pulse passes through first path A, as shown in FIG. 26 and FIG. 27.

Thus, voltage V1-reset/2 is applied to each of first and second resistance change films (both having Ron) RW1 and RW2. Voltage V1-reset/2 is greater than a threshold that changes the resistance from low resistance state Ron to high resistance state Roff.

Therefore, the use of the first voltage pulses having voltages V1-set and V1-reset and the second voltage pulse having voltage V2-set enables the erasing from the B-state to the D-state.

Erasing from C-State to D-State

Figure 30:
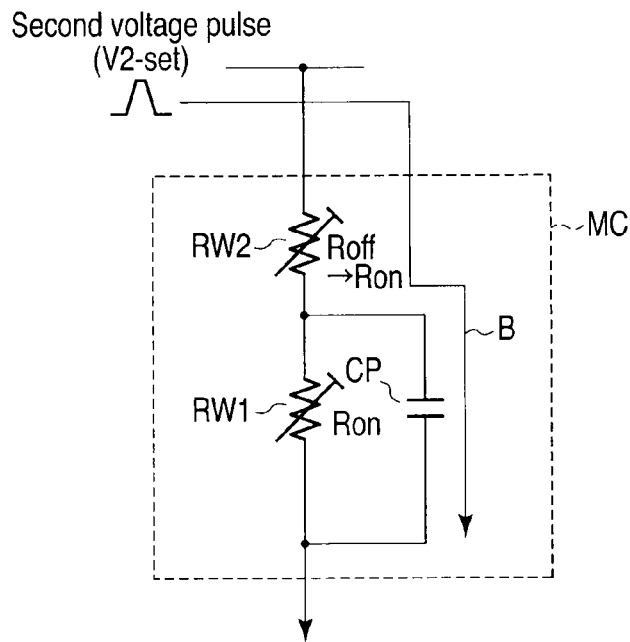
FIG. 30 shows a path of a second voltage pulse.
Figure 31:
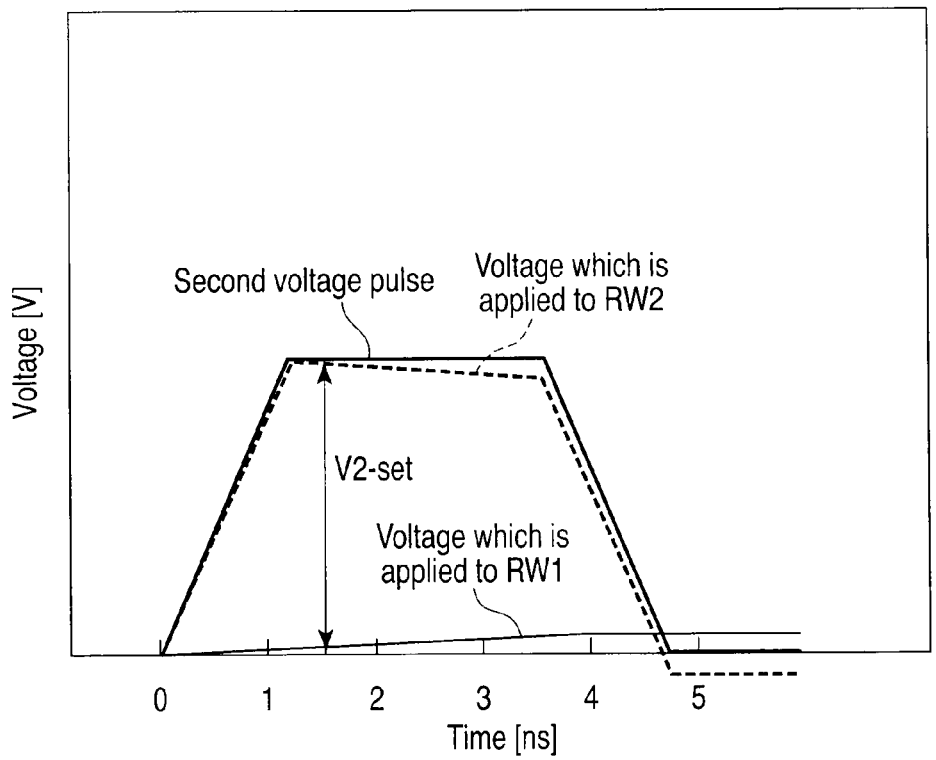
FIG. 31 shows a voltage applied to first and second resistance change films.

As shown in FIG. 25, the second voltage pulse (set pulse) having voltage V2-set is first applied to the memory cell. At the same time, the second voltage pulse passes through second path B, as shown in FIG. 30 and FIG. 31.

Thus, voltage V2-set is applied to second resistance change film (Roff) RW2. V2-set is greater than a threshold that changes the resistance from high resistance state Roff to low resistance state Ron. Therefore, the resistance of second resistance change film RW2 changes from high resistance Roff to low resistance Ron.

At this point, first and second resistance change films RW1 and RW2 are brought (unified) to the A-state. Furthermore, the first voltage pulse (set pulse) having voltage V1-set is applied to the memory cell. However, since the resistance states of first and second resistance change films RW1 and RW2 are already Ron, this state does not change.

Subsequently, the first voltage pulse (reset pulse) having voltage V1-reset is applied to the memory cell. At the same time, the first voltage pulse passes through first path A, as shown in FIG. 26 and FIG. 27.

Thus, voltage V1-reset/2 is applied to each of first and second resistance change films (both having Ron) RW1 and RW2. V1-reset/2 is greater than a threshold that changes the resistance from low resistance state Ron to high resistance state Roff.

Therefore, the use of the first voltage pulses having voltages V1-set and V1-reset and the second voltage pulse having voltage V2-set enables the erasing from the C-state to the D-state.

Erasing from D-State to D-State

As shown in FIG. 25, the second voltage pulse (set pulse) having voltage V2-set is first applied to the memory cell. At the same time, the second voltage pulse passes through second path B, as shown in FIG. 30 and FIG. 31.

Thus, voltage V2-set is applied to second resistance change film (Roff) RW2. V2-set is greater than a threshold that changes the resistance from high resistance state Roff to low resistance state Ron. Therefore, the resistance of second resistance change film RW2 changes from high resistance Roff to low resistance Ron.

Furthermore, the first voltage pulse (set pulse) having voltage V1-set is applied to the memory cell. At the same time, the first voltage pulse passes through first path A, as shown in FIG. 28 and FIG. 29.

The resistance state of first resistance change film RW1 is Roff, and the resistance state of second resistance change film RW2 is Ron. Here, voltage V1-set (RW1) applied to first resistance change film RW1 is greater than a threshold that changes the resistance from high resistance state Roff to low resistance state Ron. Thus, the resistance of first resistance change film RW1 changes from high resistance Roff to low resistance Ron.

At this point, first and second resistance change films RW1 and RW2 are brought (unified) to the A-state.

Subsequently, the first voltage pulse (reset pulse) having voltage V1-reset is applied to the memory cell. At the same time, the first voltage pulse passes through first path A, as shown in FIG. 26 and FIG. 27.

Thus, voltage V1-reset/2 is applied to each of first and second resistance change films (both having Ron) RW1 and RW2. V1-reset/2 is greater than a threshold that changes the resistance from low resistance state Ron to high resistance state Roff.

Therefore, the use of the first voltage pulses having voltages V1-set and V1-reset and the second voltage pulse having voltage V2-set enables the erasing from the D-state to the D-state.

In addition, in the erase operation described above, when V1-set is a voltage that changes the resistance states of first and second resistance change films RW1 and RW2 from high resistance state Roff to low resistance state Ron independently of the resistance states of first and second resistance change films RW1 and RW2, the second voltage pulse can be omitted, and the first voltage pulses (V1-set, V1-reset) alone can be used for erasing.

B. Read Operation

FIG. 32 shows a read operation.

Each of first and second resistance change films RW1 and RW2 is capable of storing two values, and the memory cell therefore has one of four kinds of states A, B, C and D after the write operation.

In the read operation, the first and second voltage pulses can be used to accurately read multi-level data, as in the write (set)/erase (reset) operations. However, the voltages (amplitudes) of the first and second voltage pulses are set at sufficiently low values that do no cause writing/erasing in first and second resistance change films RW1 and RW2.

The read operation is characterized in that multi-level data can be read by using two voltage pulses.

According to conventional techniques, there is only one voltage pulse path, so that each of the first and second resistance change films has different two resistance states to create four resistance states in a memory cell. To read the four resistance states, it is necessary to set, for example, three thresholds and perform reading by complex logic processing.

The read operation of this example does not require such complex logic processing and enables the simplification of the read operation and high reliability.

In the read operation of this example as well, the waveforms of the first and second voltage pulses comply with the definition in FIG. 13 and satisfy the conditions shown in Expression (1) and Expression (2).

Moreover, as in the write/erase operations, conditions of the first and second voltage pulses satisfy Expression (3) and Expression (4) when, for example, in FIG. 12, a half pitch (corresponding to F) is 12 [nm], first and second resistance change films RW1 and RW2 are made of $HfO_x$, low resistance state Ron of first and second resistance change films RW1 and RW2 is 7 [MΩ], high resistance state Roff is 70 [MΩ], and capacitance C of capacitor CP is $1.7 \times 10^{-16}$ [F].

Figure 33:
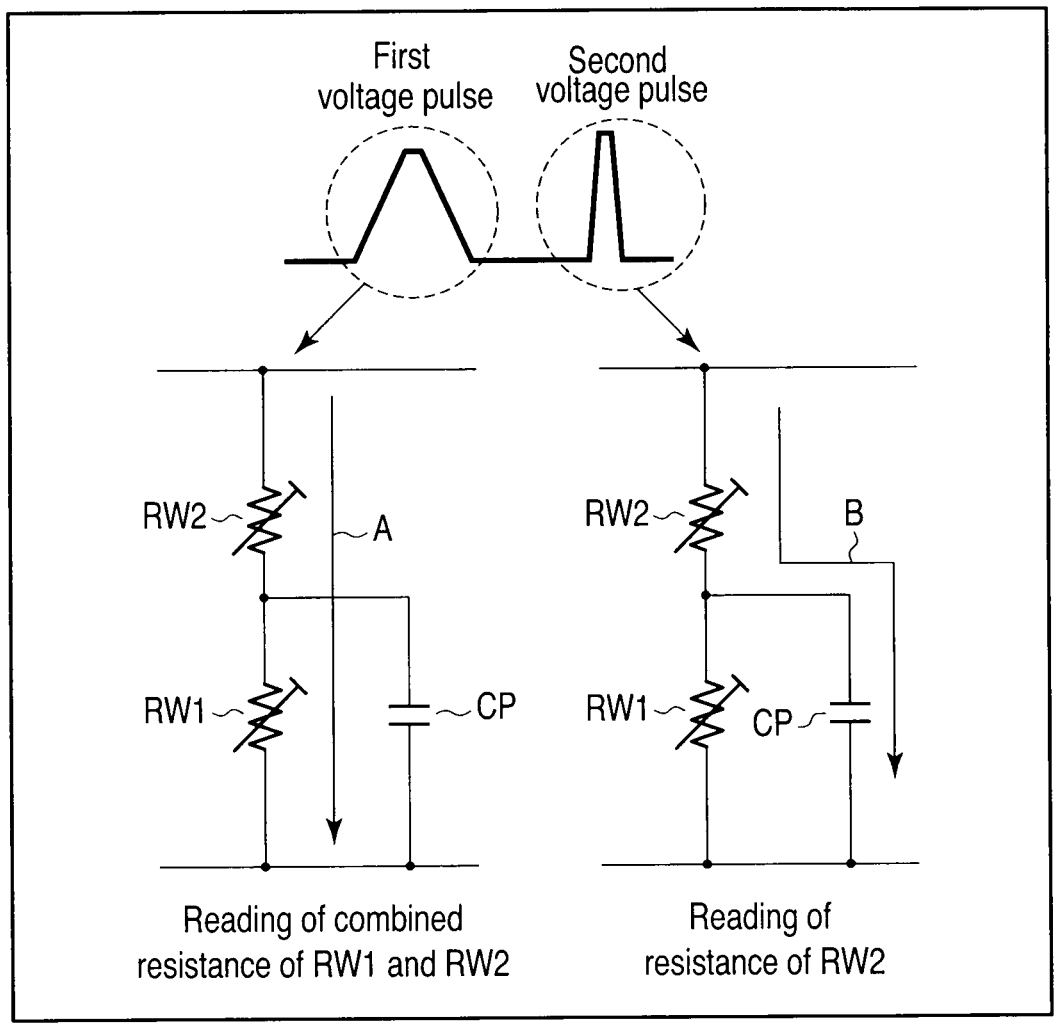
FIG. 33 shows paths of first and second voltage pulses.

In the read operation, the first voltage pulse passes through first path A, as shown in FIG. 33.

Thus, a sum of the resistances of first and second resistance change films RW1 and RW2 is read by the first voltage pulse. That is, each of the A-state (resistance R=2×Ron) and D-state (resistance R=2×Roff) can be determined by the first voltage pulse.

However, the B-state (sum resistance Rmid=Roff+Ron) and the C-state (sum resistance Rmid=Ron+Roff) have the same sum of resistance, and therefore cannot be determined by the first voltage pulse.

Accordingly, the B-state and the C-state are determined by the second voltage pulse.

In the read operation, the second voltage pulse passes through second path B, as shown in FIG. 33. Thus, the resistance of second resistance change film RW2 is read by the second voltage pulse. That is, a result of reading by the first voltage pulse and a result of reading by the second voltage pulse can be used to determine the B-state (resistance of second resistance change film RW2=Ron) and the C-state (resistance of second resistance change film RW2=Roff).

In the read operation described above, the first and second voltage pulses may be applied to the memory cell in reverse order. That is, after the resistance of second resistance change film RW2 is read by the second voltage pulse, a sum of the resistances of first and second resistance change films RW1 and RW2 may be read by the first voltage pulse.

C. Addition

The first embodiment is based on the assumption that each of first and second resistance change films RW1 and RW2 stores two values and that two resistance states of the first resistance change film are the same as two resistance states of the second resistance change film. However, as long as the conditions of the first and second voltage pulses are satisfied, the improvement of the write control performance and high reliability in the multi-level resistance change memory are enabled by exactly the same write/erase/read operations as the above-described write/erase/read operations even if two resistance states of the first resistance change film are different from two resistance states of the second resistance change film.

Figure 34:
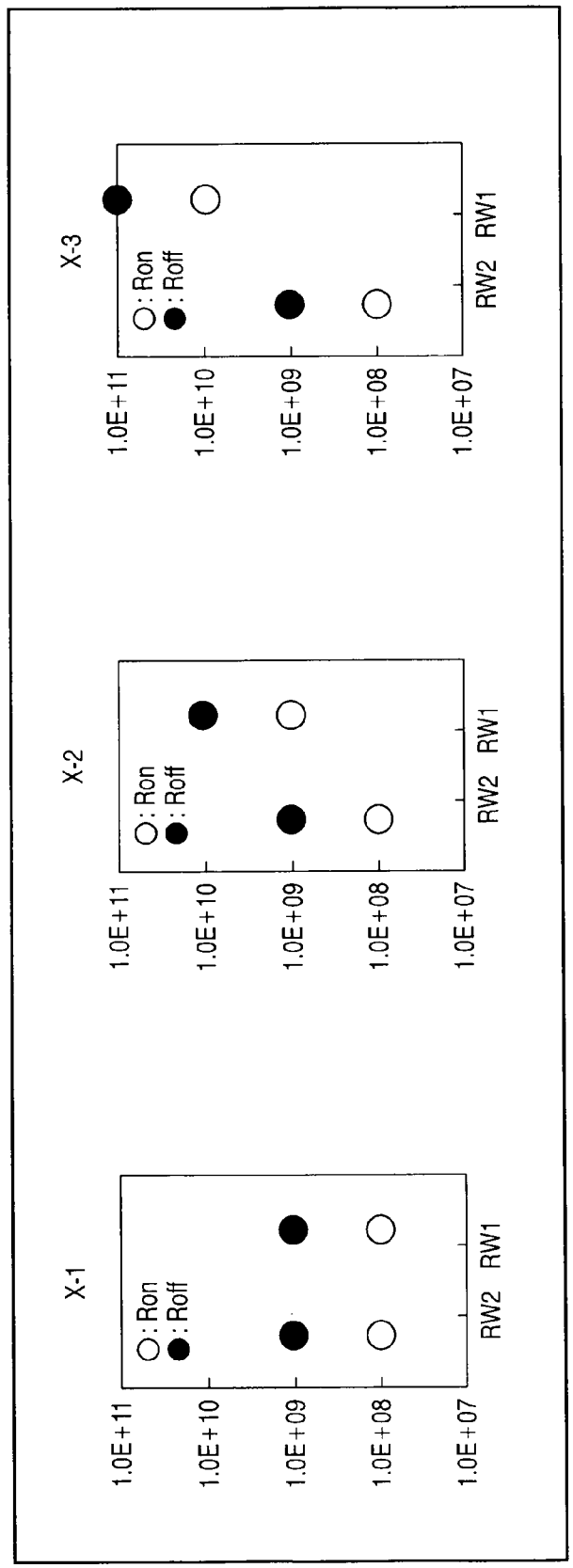
FIG. 34 shows a voltage applied to first and second resistance change films.

FIG. 34 shows the relation of the two resistance states of the first and second resistance change films.

Relation X-1 is an example wherein two resistance states of first resistance change film RW1 are the same as two resistance states of second resistance change film RW2.

Relation X-2 is an example wherein two resistance states of first resistance change film RW1 are different from two resistance states of second resistance change film RW2. In this example, resistance Ron of the low resistance state of first resistance change film RW1 is the same as resistance Roff of the high resistance state of second resistance change film RW2.

Relation X-3 is an example wherein two resistance states of first resistance change film RW1 are different from two resistance states of second resistance change film RW2. In this example, the low resistance state (resistance Ron) of first resistance change film RW1 is greater than the resistance (resistance Roff) of the high resistance state of second resistance change film RW2.

Figure 35:
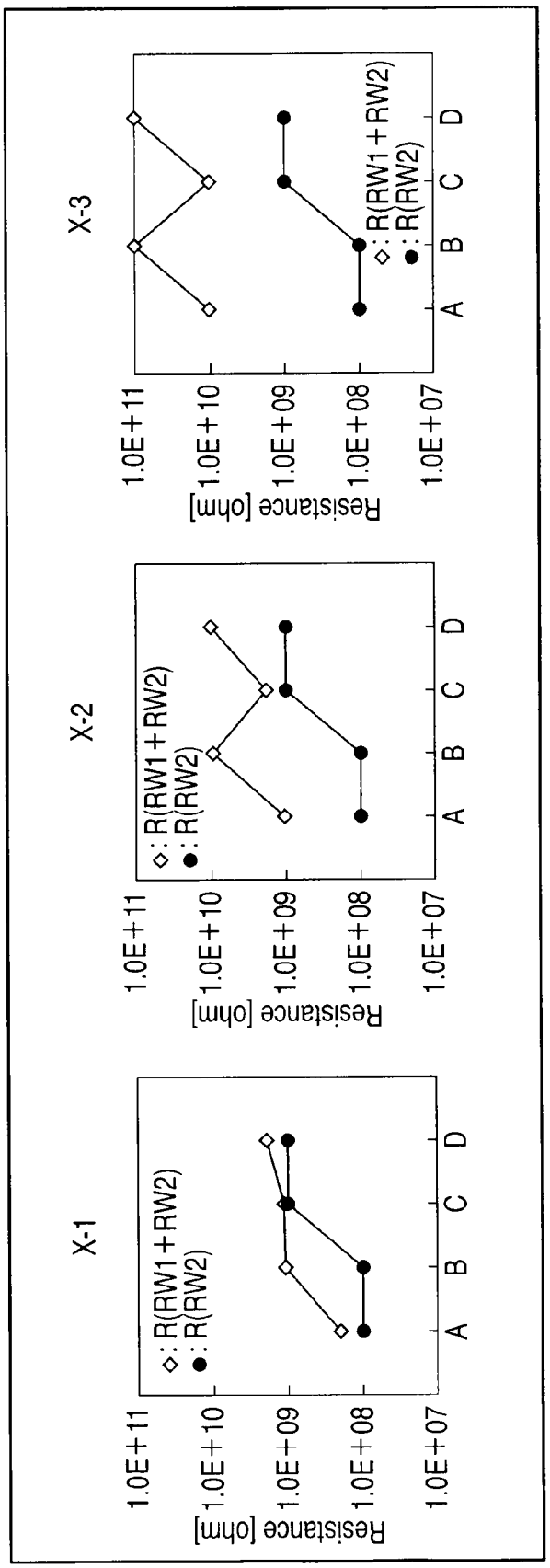
FIG. 35 shows a change of a sum of resistances of memory cells.

FIG. 35 shows a change of a sum of the resistances of the memory cells.

When two resistance states of each of first and second resistance change films RW1 and RW2 have relation X-1 shown in FIG. 34, sum resistance R (rhombus) of first and second resistance change films RW1 and RW2 changes, for example, as indicated by X-1 shown in FIG. 35.

When two resistance states of each of first and second resistance change films RW1 and RW2 have relation X-2 shown in FIG. 34, sum resistance R (rhombus) of first and second resistance change films RW1 and RW2 changes, for example, as indicated by X-2 shown in FIG. 35.

When two resistance states of each of first and second resistance change films RW1 and RW2 have relation X-3 shown in FIG. 34, sum resistance R (rhombus) of first and second resistance change films RW1 and RW2 changes, for example, as indicated by X-3 shown in FIG. 35.

It is appreciated from FIG. 35 that if the region for the two resistance states of first resistance change film RW1 is completely different from the region for the two resistance states of second resistance change film RW2, read margins of the C-state and F-state (difference between their sum resistances) are increased. The increase of the read margins enables higher reliability.

Furthermore, when two resistance states of first resistance change film RW1 are different from two resistance states of second resistance change film RW2, the following advantages are provided as one embodiment: no necessity for the reset pulse in the write operation, and a smaller number of voltage pulse applications in the erase operation. Such advantages are described in detail in the second embodiment below.

(3) Second Embodiment

According to the second embodiment, each of the first and second resistance change films stores two values, and two resistance states (high resistance/low resistance) of the first resistance change film are different from two resistance states (high resistance/low resistance) of the second resistance change film.

The two resistance states of each of the first and second resistance change films have relation X-3 shown in FIG. 34 and FIG. 35.

A. Regarding Initialization (Forming)

First, a method of forming first and second resistance change films RW1 and RW2 having relation X-3 shown in FIG. 34 and FIG. 35 is described. Here, first and second resistance change films RW1 and RW2 are made of the same material.

When first and second resistance change films RW1 and RW2 are made of a transition metal oxide such as $HfO_x$, first and second resistance change films RW1 and RW2 have to be initialized at the time of device manufacture in order to perform a switching (repetition of set/reset operations) operation.

This initialization is generally called forming.

The two resistance states (resistance variable region) of each of first and second resistance change films RW1 and RW2 can be changed by a forming condition.

Figure 36:
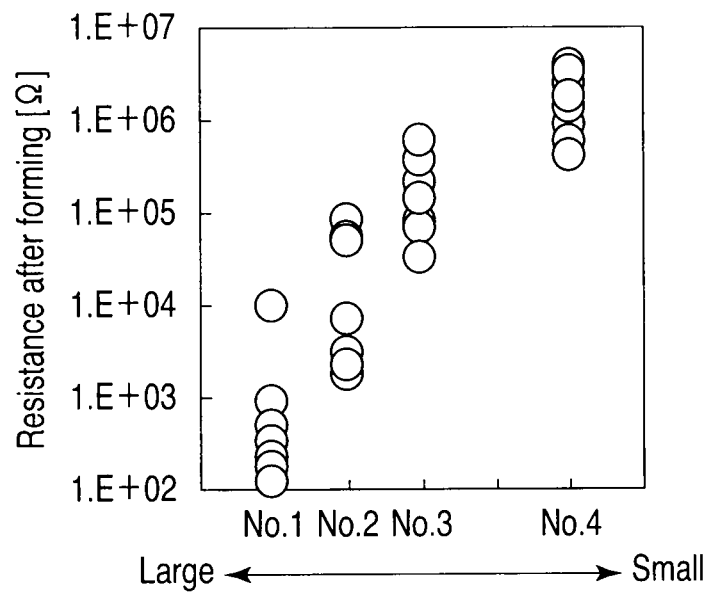
FIGS. 36 and 37 show a forming.

FIG. 36 shows the relation between the forming condition and the resistance of the resistance change film after forming of the resistance change film.

The resistance change film is made of $HfO_x$. The forming condition is that a maximum current flowing to the resistance change film when a voltage pulse is being applied to the resistance change film is used as a parameter. There are four kinds of samples No. 1, No. 2, No. 3 and No. 4.

It is appreciated from FIG. 36 that resistance Rform of the resistance change film after the forming is shifted toward higher resistance when the maximum current flowing to the resistance change film during the application of the voltage pulse is lower.

Figure 37:
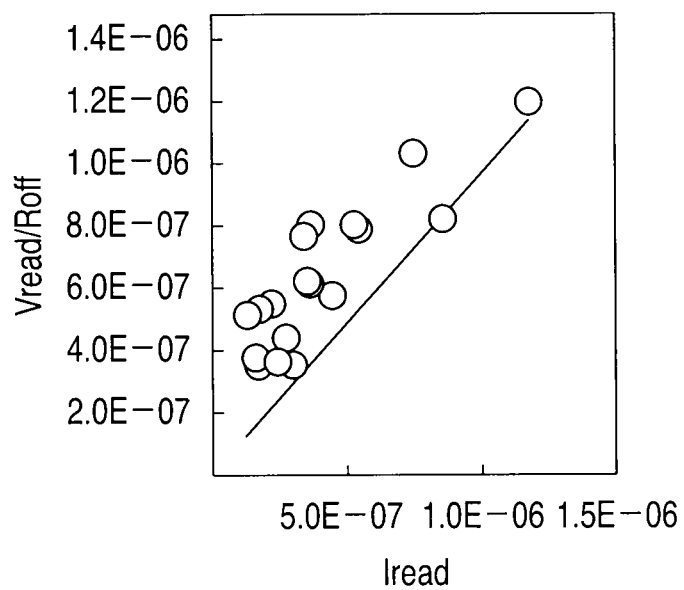

FIG. 37 shows the relation between the resistance after forming (plotted by read currents in the resistance state after forming in FIG. 37) and the resistance of the resistance change film in the high resistance state.

Resistance Roff of the high resistance state of the resistance change film is decided, for example, depending on resistance Rform in the samples No. 1, No. 2, No. 3 and No. 4 shown in FIG. 36.

FIG. 38 shows a method of actually forming first and second resistance change films RW1 and RW2 in memory cell MC shown in FIG. 1.

In the forming, the first and second voltage pulses (forming pulses) are used. The first and second voltage pulses satisfy the conditions shown in Expression (1) and Expression (2) and the conditions shown in Expression (3) and Expression (4).

First resistance change film RW1 is formed by the first voltage pulse, and second resistance change film RW2 is formed by the second voltage pulse. The order of forming first and second resistance change films RW1 and RW2 is not specifically limited.

However, if forming is performed, the resistance after forming is, in general, several digits lower than the resistance before forming. In the order shown in FIG. 38, the state of "the resistance of RW2 (after forming)<<the resistance of RW1 (before forming)" is generated while the first voltage pulse is applied, and the voltage is distributed substantially entirely to RW1. On the other hand, in the order of a reverse to that shown in FIG. 38, the state of "the resistance of RW2 (before forming)=the resistance of RW1 (before forming)" is generated, and half the voltage is equally distributed to each of RW1 and RW2. Thus, the applied voltage in the latter case has to be about twice the voltage in the former case. Therefore, the former case (order shown in FIG. 38) that can use the lower voltage is preferable.

First, the second voltage pulse (forming pulse) is applied to the memory cell. At the same time, the second voltage pulse passes through second path B.

Second resistance change film RW2 can be formed by controlling the maximum current flowing to second resistance change film RW2 when the second voltage pulse is applied to second resistance change film RW2.

Subsequently, the first voltage pulse (forming pulse) is applied to the memory cell. At the same time, the first voltage pulse passes through first path A. Thus, to first and second resistance change films RW1 and RW2, voltages adapted to their resistance ratio are applied.

Here, second resistance change film RW2 is already formed, and its resistance is reduced by several digits. That is, the resistance of second resistance change film RW2 is several digits lower than the resistance of first resistance change film RW1.

Thus, when the first voltage pulse is applied to the memory cell, the voltage of the first voltage pulse is almost entirely applied to first resistance change film RW1.

Therefore, first resistance change film RW1 can be formed by controlling the maximum current flowing to first and second resistance change films RW1 and RW2 when the first voltage pulse is applied to first and second resistance change films RW1 and RW2.

In addition, the maximum current used for the forming of first and second resistance change films RW1 and RW2 is controlled by a current control circuit.

If the maximum current used for the forming of first resistance change film RW1 is lower than the maximum current used for the forming of second resistance change film RW2, the resistance variable region of first resistance change film RW1 can be more shifted toward high resistance than the resistance variable region of second resistance change film RW2 even when first and second resistance change films RW1 and RW2 are made of the same material.

In the meantime, second resistance change film RW2 can be reformed by the second voltage pulse after first and second resistance change films RW1 and RW2 are formed by the first voltage pulse.

According to the forming method described above, for example, two resistance states (high resistance/low resistance) of first resistance change film RW1 and two resistance states (high resistance/low resistance) of second resistance change film RW2 can be created by the relation indicated by X-3 in FIG. 34 (a relation in which the resistance variable regions differ from each other by two digits).

Multi-level data write/erase/read operations are described below. Although an erase state is set to high resistance in the example described below, the erase state may be set to low resistance. In this case, erase can be read for write and write can be read for erase in the following explanation when necessary.

B. Write/Erase Operations

FIG. 39 shows the write operation. FIG. 46 shows the erase operation.

Since each of first and second resistance change films RW1 and RW2 is capable of storing two values, the memory cell can take one of four kinds of states A, B, C and D. Here, the D-state is a reset state "00". In the D-state, the resistance of each of first and second resistance change films RW1 and RW2 is at high resistance.

Here, a write operation from the D-state (initial state) to the A-state, B-state or C-state, and an erase operation from the A-state, B-state, C-state or D-state to the D-state are described. The waveforms of the first and second voltage pulses comply with the definition in FIG. 13 and satisfy the conditions shown in Expression (1) and Expression (2).

As in the first embodiment, conditions of the first and second voltage pulses satisfy Expression (3) and Expression (4) when, for example, in FIG. 12, a half pitch (corresponding to F) is 12 [nm], first and second resistance change films RW1 and RW2 are made of $HfO_x$, low resistance state Ron of first and second resistance change films RW1 and RW2 is 7 [MΩ], high resistance state Roff is 70 [MΩ], and capacitance C of capacitor CP is $1.7 \times 10^{-16}$ [F].

B.-1. Write Operation

In the write operation, for example, the first voltage pulse (set pulse) having voltage (amplitude) V1-set and the second voltage pulse (set pulse) having voltage (amplitude) V2-set are used.

The first voltage pulse functions to change the resistance state of first resistance change film RW1 having its resistance variable region on a higher resistance side from high resistance Roff to low resistance Ron. The second voltage pulse functions to change the resistance state of second resistance change film RW2 having its resistance variable region on a lower resistance side from high resistance Roff to low resistance Ron.

Writing from D-State to A-State

Figure 40:
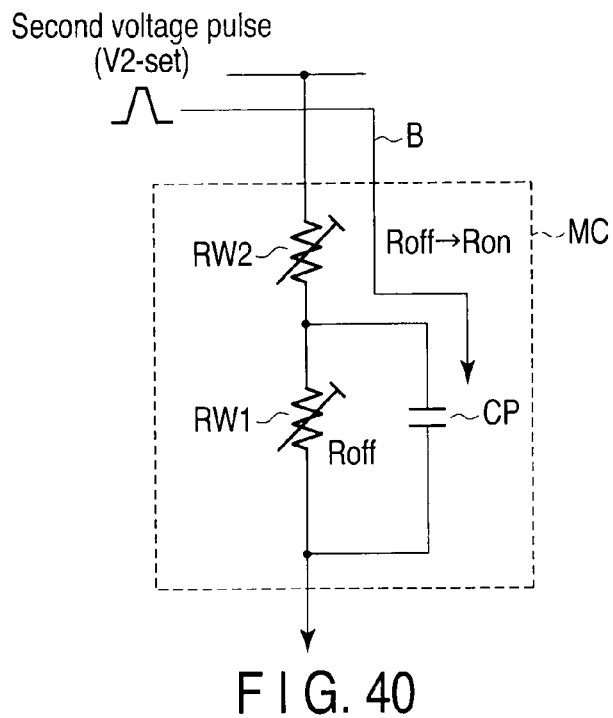
FIG. 40 shows a path of a second voltage pulse.
Figure 41:
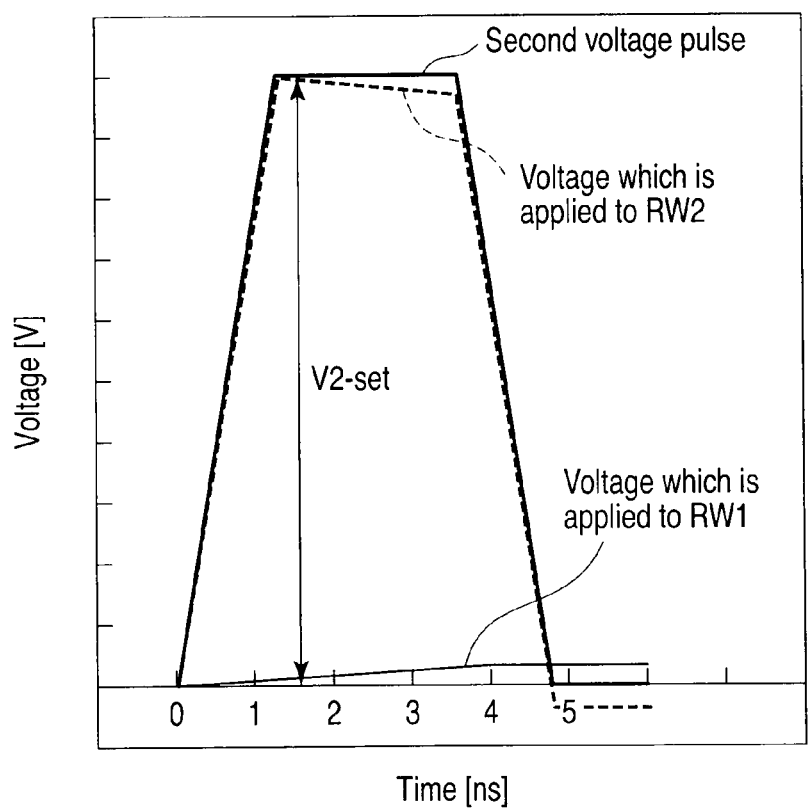
FIG. 41 shows a voltage applied to first and second resistance change films.

As shown in FIG. 39, the second voltage pulse (set pulse) having voltage V2-set is applied to the memory cell. At the same time, the second voltage pulse passes through second path B, as shown in FIG. 40 and FIG. 41.

Thus, voltage V2-set is applied to second resistance change film (Roff) RW2. V2-set is greater than a threshold that changes the resistance from high resistance state Roff to low resistance state Ron.

Thus, second resistance change film RW2 changes from high resistance Roff to low resistance Ron.

Subsequently, the first voltage pulse (set pulse) having voltage V1-set is applied to the memory cell.

At the same time, the first voltage pulse passes through first path A, as shown in FIG. 42 and FIG. 43. Moreover, since second resistance change film RW2 is in the low resistance state (Ron), voltage V1-set is almost entirely applied to first resistance change film RW1 in the high resistance state (Roff). V1-set is greater than a threshold that changes the resistance from high resistance state Roff to low resistance state Ron.

Thus, first resistance change film RW1 changes from high resistance Roff to low resistance Ron.

In this way, the first voltage pulse having V1-set and the second voltage pulse having V2-set enable the writing from the D-state to the A-state.

The writing from the D-state to the A-state can also be performed by applying the second voltage pulse to the memory cell after the first voltage pulse is applied to the memory cell. The reason is that Roff(RW1)>Roff(RW2), so that RW1 alone can be set even by the first voltage pulse.

Writing from D-State to B-State

As shown in FIG. 39, the second voltage pulse (set pulse) having voltage V2-set has only to be applied to the memory cell. At the same time, the second voltage pulse passes through second path B, as shown in FIG. 40 and FIG. 41.

Thus, voltage V2-set is applied to second resistance change film (Roff) RW2. V2-set is greater than a threshold that changes the resistance from high resistance state Roff to low resistance state Ron.

Therefore, the second voltage pulse having V2-set enables the writing from the D-state to the B-state.

Writing from D-State to C-State

As shown in FIG. 39, the first voltage pulse (set pulse) having voltage V1-set has only to be applied to the memory cell. At the same time, the first voltage pulse passes through first path A, as shown in FIG. 44 and FIG. 45.

Moreover, since the high resistance state (Roff) of second resistance change film RW2 is lower than the high resistance state (Roff) of first resistance change film RW1 (see the relation X-3 shown in FIG. 34), voltage V1-set is almost entirely applied to first resistance change film RW1. V1-set is greater than a threshold that changes the resistance from high resistance state Roff to low resistance state Ron, so that the writing from the D-state to the C-state can be performed by the first voltage pulse having V1-set.

B.-2. Erase Operation

In the erase operation, for example, the first voltage pulse (reset pulse) having voltage (amplitude) V1-reset and the second voltage pulse (reset pulse) having voltage (amplitude) V2-reset are used.

When the resistance state of first resistance change film RW1 is at low resistance Ron, the first voltage pulse changes the resistance state of first resistance change film RW1 from low resistance Ron to high resistance Roff. When the resistance state of second resistance change film RW2 is at low resistance Ron, the second voltage pulse changes the resistance state of second resistance change film RW2 from low resistance state Ron to high resistance state Roff.

This example is based on the assumption that the moving directions (polar characters) of the first and second voltage pulses in a writing are the same as the moving directions (polar characters) of the first and second voltage pulses in an erasing. However, the erase operation can be performed so that the (polar characters) of the first and second voltage pulses in the erasing may be different from the (polar characters) of the first and second voltage pulses in the writing.

All of the erasing from the A-state, B-state, C-state and D-state to the D-state can be performed by the same operation.

Erasing from A-State to D-State

As shown in FIG. 46, the second voltage pulse (reset pulse) having voltage V2-reset is applied to the memory cell. At the same time, the second voltage pulse passes through second path B, as shown in FIG. 47 and FIG. 48.

Thus, voltage V2-reset is applied to second resistance change film (Ron) RW2. V2-reset is greater than a threshold that changes the resistance from low resistance state Ron to high resistance state Roff.

Therefore, second resistance change film RW2 is brought to high resistance state Roff by the second voltage pulse having voltage V2-reset.

Subsequently, the first voltage pulse (reset pulse) having voltage V1-reset is applied to the memory cell. At the same time, the first voltage pulse passes through first path A, as shown in FIG. 49 and FIG. 50.

Thus, voltage V1-reset is applied to first resistance change film (Ron) RW1 and second resistance change film (Roff) RW2. When first resistance change film RW1 is at low resistance Ron and second resistance change film RW2 is at high resistance Roff, V1-reset is greater than a threshold that changes the resistance of first resistance change film RW1 from low resistance state Ron to high resistance state Roff. Here, as Roff (RW2)<<Ron (RW1), the voltage is substantially entirely distributed to RW1. Therefore, RW1 can be reset without excessively increasing the voltage of the first voltage pulse.

Consequently, first resistance change film RW1 is brought to high resistance state Roff by the first voltage pulse having voltage V1-reset.

Therefore, the first voltage pulse having V1-reset and the second voltage pulse having V2-reset enable the erasing from the A-state to the D-state.

Erasing from B-State to D-State

As shown in FIG. 46, the second voltage pulse (reset pulse) having voltage V2-reset is first applied to the memory cell. At the same time, the second voltage pulse passes through second path B, as shown in FIG. 47 and FIG. 48.

Thus, voltage V2-reset is applied to second resistance change film (Ron) RW2. V2-reset is greater than a threshold that changes the resistance from low resistance state Ron to high resistance state Roff.

Therefore, second resistance change film RW2 is brought to high resistance state Roff by the second voltage pulse having voltage V2-reset.

Subsequently, the first voltage pulse (reset pulse) having voltage V1-reset is applied to the memory cell. At the same time, the first voltage pulse passes through first path A. However, since the resistance state of first resistance change film RW1 is Roff, this state does not change.

In this way, the first voltage pulse having V1-reset and the second voltage pulse having V2-reset enable the writing from the B-state to the D-state.

Erasing from C-State to D-State

As shown in FIG. 46, the second voltage pulse (reset pulse) having voltage V2-reset is applied to the memory cell. At the same time, the second voltage pulse passes through second path B. However, since the resistance state of second resistance change film RW2 is Roff, this state does not change.

Subsequently, the first voltage pulse (reset pulse) having voltage V1-reset is applied to the memory cell. At the same time, the first voltage pulse passes through first path A, as shown in FIG. 49 and FIG. 50.

Thus, voltage V1-reset is applied to first resistance change film (Ron) RW1 and second resistance change film (Roff) RW2. When first resistance change film RW1 is in low resistance state Ron and second resistance change film RW2 is in high resistance state Roff, V1-reset is greater than a threshold that changes the resistance of first resistance change film RW1 from low resistance state Ron to high resistance state Roff. Here, as Roff (RW2)<<Ron (RW1), the voltage is substantially entirely distributed to RW1. Therefore, RW1 can be reset without excessively increasing the voltage of the first voltage pulse.

Consequently, first resistance change film RW1 is brought to high resistance state Roff by the first voltage pulse having voltage V1-reset.

In this way, the first voltage pulse having V1-reset and the second voltage pulse having V2-reset enable the erasing from the C-state to the D-state.

Erasing from D-State to D-State

As shown in FIG. 46, the second voltage pulse (reset pulse) having voltage V2-reset is first applied to the memory cell. At the same time, the second voltage pulse passes through second path B. However, since the resistance state of second resistance change film RW2 is Roff, this state does not change.

Subsequently, the first voltage pulse (reset pulse) having voltage V1-reset is applied to the memory cell. At the same time, the first voltage pulse passes through first path A. However, since the resistance state of first resistance change film RW1 is Roff, this state does not change.

In this way, the first voltage pulse having V1-reset and the second voltage pulse having V2-reset enable the erasing from the D-state to the D-state.

In the erase operation described above, the first and second voltage pulses may be applied to the memory cell in reverse order. That is, after the first voltage pulse is applied to the memory cell to bring first resistance change film RW1 to high resistance state Roff, the second voltage pulse may be applied to the memory cell to bring second resistance change film RW2 to high resistance state Roff.

This erase operation is characterized in that since the resistance (Roff/Ron) of first resistance change film RW1 is always greater than the resistance (Roff/Ron) of second resistance change film RW2 (e.g., the relation X-3 shown in FIG. 34), two kinds of reset pulses can be used for erasing. This means that the erase (reset) operation can be simpler than, for example, in the first embodiment. Therefore, according to the erase operation in the second embodiment, it is possible to reduce an erase time and enhance performance as a result of reduced stress of the voltage applied to the memory cell.

C. Read Operation

The read operation can be performed by a method similar to that in the first embodiment (see FIG. 32 and FIG. 33), and is therefore not described in detail here.

Moreover, according to the second embodiment, the resistances (the sum of the resistances of first and second resistance change films RW1 and RW2) of four cell states (A-state, B-state, C-state and D-state) can be different from one another. In this case, reading can be performed by using the first voltage pulse alone.

3. Modification Example (1) Modification Example of Basic Concept

According to the basic concept of the multi-level resistance change memory, the memory cell has a structure having two resistance change films (first and second resistance change films) connected in series, as described above. According to this basic concept, it is easily assumed that three or more resistance change films can be connected in series to comprise a memory cell.

In this modification example, a memory cell structure having four resistance change films (first to fourth resistance change films) connected in series is described.

FIG. 51 shows a circuitry of a multi-level resistance change memory.

Memory cell MC in memory cell array 11 comprises first to fourth resistance change films RW1, . . . RW4 connected in series.

One end of first resistance change film RW1 is connected to first node N1, and the other end thereof is connected to second node N2. One end of second resistance change film RW2 is connected to second node N2, and the other end thereof is connected to third node N3.

One end of third resistance change film RW3 is connected to third node N3, and the other end thereof is connected to fourth node N4. One end of fourth resistance change film RW4 is connected to fourth node N4, and the other end thereof is connected to fifth node N5.

Capacitor CP1 is connected between first and second nodes N1 and N2. Capacitor CP2 is connected between first and third nodes N1 and N3. Capacitor CP3 is connected between first and fourth nodes N1 and N4.

Voltage pulse generating circuit 21 generates a first voltage pulse which passes through first path A including first to fourth resistance change films RW1, . . . RW4, a second voltage pulse which passes through second path B including second to fourth resistance change films RW2, . . . RW4 and capacitor CP1, a third voltage pulse which passes through third path C including third and fourth resistance change films RW3 and RW4 and capacitor CP2, and a fourth voltage pulse which passes through fourth path D including fourth resistance change film RW4 and capacitor CP3.

In order to vary movement routes of the first to fourth voltage pulses, waveforms of the first to fourth voltage pulses may be varied.

Specifically, when first to third capacitors CP1, CP2 and CP3 have the same capacitance value, the situation is as follows.

A pulse width of the first voltage pulse is larger than a product of a capacitance of capacitor CP1 and a sum of resistances of second to fourth resistance change films RW2, . . . RW4 before application of the first voltage pulse to memory cell MC.

A pulse width of the second voltage pulse is smaller than a product of a capacitance of capacitor CP1 and a sum of resistances of second to fourth resistance change films RW2, . . . RW4 before application of the second voltage pulse to memory cell MC, and is larger than a product of a capacitance of capacitor CP2 and a sum of resistances of third and fourth resistance change films RW3 and RW4 before application of the second voltage pulse to memory cell MC.

A pulse width of the third voltage pulse is smaller than a product of a capacitance of capacitor CP2 and a sum of resistances of third and fourth resistance change films RW3 and RW4 before application of the third voltage pulse to memory cell MC, and is larger than a product of a capacitance of capacitor CP3 and a resistance of fourth resistance change film RW4 before application of the third voltage pulse to memory cell MC.

A pulse width of the fourth voltage pulse is smaller than a product of a capacitance of capacitor CP3 and a resistance of fourth resistance change film RW4 before application of the fourth voltage pulse to memory cell MC.

Control circuit 22 stores multi-level data in the memory cell by using the first and second voltage pulses in a writing.

For example, when each of first to fourth resistance change films RW1, . . . RW4 is capable of storing two kinds of resistances (two values), memory cell MC is capable of storing 16 values. In general, when each of first to fourth resistance change films RW1, . . . RW4 is capable of storing $2^n$ kinds of resistances ($2^n$ values), memory cell MC is capable of storing $2^{4 \times n}$ values. However, n is a natural number.

Thus, first path A including first to fourth resistance change films RW1, . . . RW4, second path B including second to fourth resistance change films RW2, . . . RW4 and capacitor CP1, third path C including third and fourth resistance change films RW3 and RW4 and capacitor CP2, and fourth path D including fourth resistance change film RW4 and capacitor CP3 are provided. Accordingly, it is possible to obtain a multi-level resistance change memory high in write control performance and high in reliability.

In addition, it is desirable that the resistance variable regions of first to fourth resistance change films RW1, . . . RW4 be different, that the resistance variable region of first resistance change film RW1 be disposed on a highest resistance side, that the resistance variable regions of second to fourth resistance change films RW2, . . . RW4 be gradually shifted to a lower resistance side, and that the resistance variable region of fourth resistance change film RW4 be disposed on a lowest resistance side.

Figure 52:
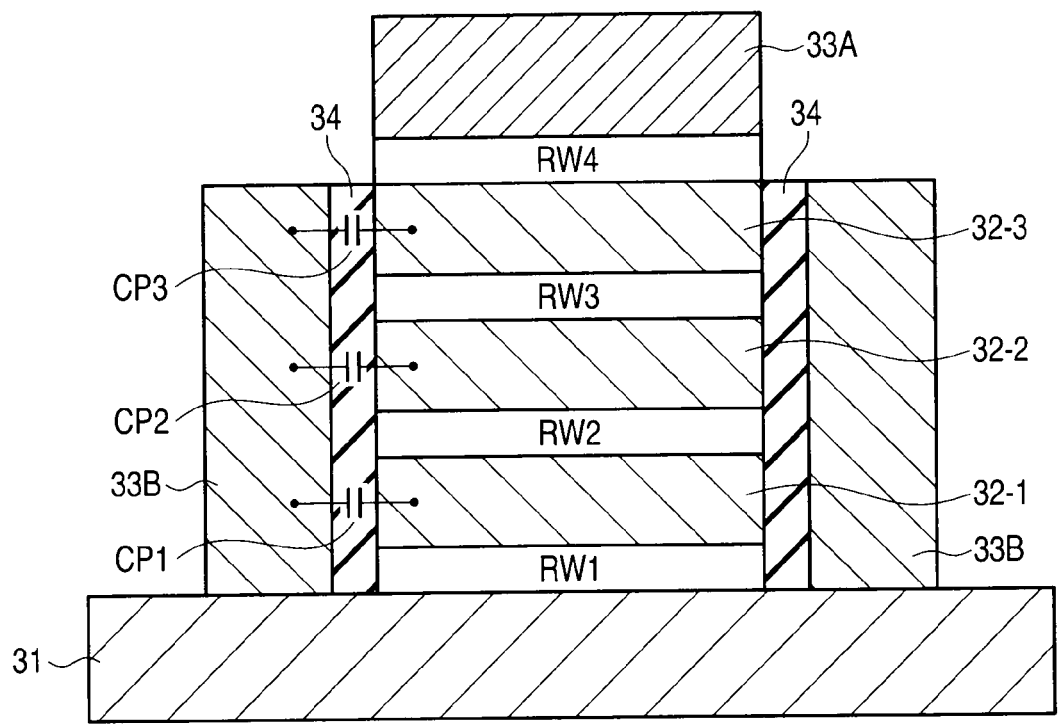

FIG. 52 shows a device structure of the memory cell of the multi-level resistance change memory.

This device structure is one embodiment for obtaining the circuitry shown in FIG. 51.

First resistance change film RW1 is disposed on first electrode 31. First metal layer 32-1 is disposed on first resistance change film RW1. Second resistance change film RW2 is disposed on first metal layer 32-1. Second metal layer 32-2 is disposed on second resistance change film RW2.

Third resistance change film RW3 is disposed on second metal layer 32-2. Third metal layer 32-3 is disposed on third resistance change film RW3. Fourth resistance change film RW4 is disposed on third metal layer 32-3. Second electrode 33A is disposed on fourth resistance change film RW4.

Insulating layer 34 covers side surfaces of first to third metal layers 32-1, 32-2 and 32-3. Second metal layer 33B contacts first electrode 31, and is opposite to the side surfaces of first to third metal layers 32-1, 32-2 and 32-3 across insulating layer 34.

First to third metal layers 32-1, 32-2 and 32-3, insulating layer 34 and second metal layer 33B constitute capacitors CP1, CP2 and CP3.

As has been described in connection with the device structure in FIG. 2 and FIG. 3, the entire shape of first to fourth resistance change films RW1, . . . RW4 and first to third metal layers 32-1, 32-2 and 32-3 is not limited, and is allowed to be, for example, a columnar shape or prismatic shape.

Moreover, second metal layer 33B has a ring shape that surrounds the side surfaces of first to third metal layers 32-1, 32-2 and 32-3, but is not limited to this shape. For example, second metal layer 33B may have a partially cut ring shape (C-shape).

(2) Modification Examples of Manufacturing Method

Modification examples of the manufacturing method of the device structure shown in FIG. 2 and FIG. 3 are described.

A. First Modification Example

Figure 53:
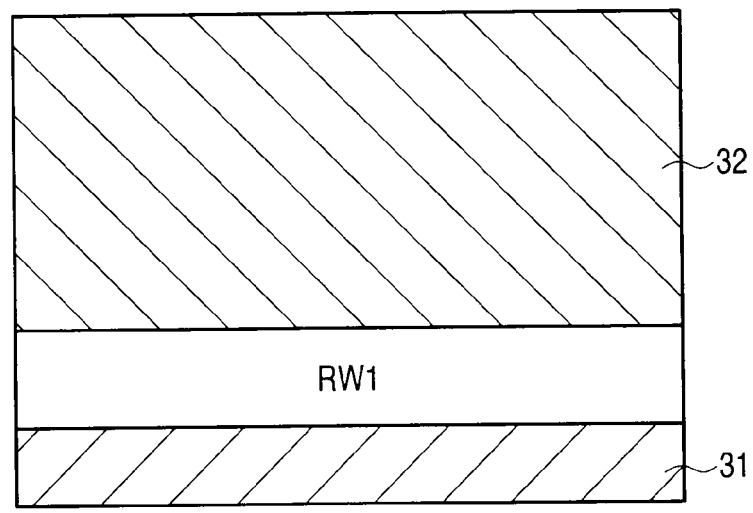

First, as shown in FIG. 53, a stack structure comprising first resistance change film RW1 and first metal layer 32 is formed on first electrode 31. First resistance change film RW1 is made of a metal oxide such as $HfO_x$ ($0<x$).

$HfO_x$ can be formed by, for example, the CVD method, ALD method or sputtering method. First metal layer 32 is made of a metal such as Ti.

Furthermore, as shown in FIG. 54, a photomask is formed by the PEP. This photomask is used as a mask to pattern the stack structure comprising first resistance change film RW1 and first metal layer 32 by anisotropic etching such as RIE.

Subsequently, the side surface and upper surface of first metal layer 32 are oxidized, and insulating layer 34 is formed on the side surface and upper surface of first metal layer 32 as shown in FIG. 55. Here, when first metal layer 32 is made of Ti, insulating layer 34 is $TiO_x$ ($0<x$).

This oxidation may be simultaneous with or separate from the removal (ashing) of the photomask.

Figure 56:
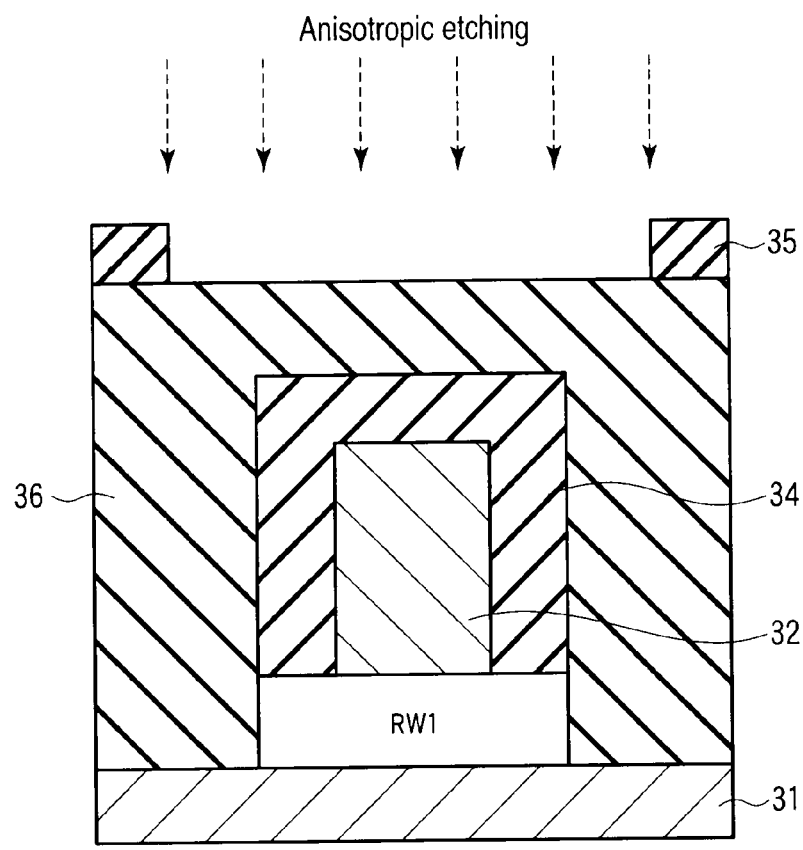

Furthermore, as shown in FIG. 56, interlayer insulating film (e.g., $SiO_2$) 36 covering first resistance change film RW1, first metal layer 32 and insulating layer 34 is formed. Photomask 35 is formed on insulating layer 36 by the PEP. Photomask 35 is used as a mask to etch insulating layer 36 by anisotropic etching such as RIE.

Figure 57:
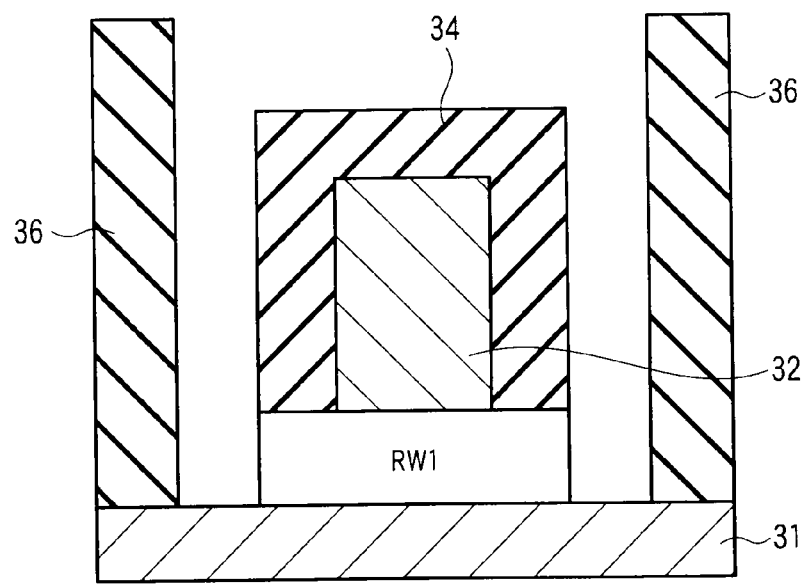

As a result, as shown in FIG. 57, a hole is made in interlayer insulating film 36. This hole is made within a range including the stack structure comprising first resistance change film RW1, first metal layer 32 and insulating layer 34.

Furthermore, as shown in FIG. 58, the hole in interlayer insulating film 36 is filled with second metal layer 33B by the CVD method and a CMP method. Second metal layer 33B is made of, for example, $TiN_x$ ($0<x$). Second metal layer 33B covers the bare upper surface and side surface of insulating layer 34.

Still further, as shown in FIG. 59, insulating layer 34, second metal layer 33B and interlayer insulating film 36 are polished until the upper surface of first metal layer 32 is exposed.

Finally, as shown in FIG. 60, second resistance change film RW2 is formed on first metal layer 32, and second electrode 33A is formed on second resistance change film RW2.

Second electrode 33A may be patterned after or simultaneously with the patterning of second resistance change film RW2.

Second resistance change film RW2 is made of the same material as first resistance change film RW1, for example, a metal oxide such as $HfO_x$ ($0<x$).

Through the process described above, the device structure shown in FIG. 2 and FIG. 3 is completed.

B. Second Modification Example

First, as shown in FIG. 55, insulating layer 34 is formed on the side surface and upper surface of first metal layer 32 by using the same process as that in the first modification example.

Furthermore, as shown in FIG. 61, second metal layer 33B covering first resistance change film RW1, first metal layer 32 and insulating layer 34 is formed. Second metal layer 33B is made of, for example, $TiN_x$ (0<x). Second metal layer 33B covers the bare upper surface and side surface of insulating layer 34.

Still further, as shown in FIG. 62, insulating layer 34 and second metal layer 33B are polished until the upper surface of first metal layer 32 is exposed.

Finally, as shown in FIG. 63, second resistance change film RW2 is formed on first metal layer 32, and second electrode 33A is formed on second resistance change film RW2.

Second electrode 33A may be patterned after or simultaneously with the patterning of second resistance change film RW2.

Second resistance change film RW2 is made of the same material as first resistance change film RW1, for example, a metal oxide such as $HfO_x$ (0<x).

Through the process described above, the device structure shown in FIG. 2 and FIG. 3 is completed.

C. Addition

In the manufacturing methods according to first and second modification examples, thin insulating layer 34 may remain between first metal layer 32 and second resistance change film RW2, as shown in FIG. 64.

For example, if insulating layer 34 between first metal layer 32 and second resistance change film RW2 is 4 nm or less, insulating layer 34 can be used as a part of second resistance change film RW2 by the forming described above.

In this case, insulating layer 34 and second resistance change film RW2 are desirably made of the same material. For example, first metal layer 32 can be made of Hf, insulating layer 34 can be made of $HfO_x$, and first and second resistance change films RW1 and RW2 can be made of $HfO_x$. Alternatively, first metal layer 32 can be made of Ti, insulating layer 34 can be made of $TiO_x$, and first and second resistance change films RW1 and RW2 can be made of $TiO_x$.

In this case, insulating layer 34 on the side surface of first metal layer 32 is set at, for example, a value of more than 4 nm, and functions as a high-dielectric-constant (high-k) film.

4. Conclusion

According to the embodiments, it is possible to obtain a multi-level resistance change memory high in write control performance and high in reliability. In the embodiments, the memory cell may include a selector (e.g., a diode). The selector is connected in series to the first and second resistance change films RW1, RW2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multi-level resistance change memory comprising:
a memory cell comprising a first resistance change film, one end of the first resistance change film connected to a first node, and the other end of the first resistance change film connected to a second node; a second resistance change film, one end of the second resistance change film connected to a third node, and the other end of the second resistance change film connected to the second node; and a capacitor connected between the first and second nodes;
a voltage pulse generating circuit generating a first voltage pulse with a first pulse width to divide a voltage of the first voltage pulse into the first and second resistance change films based on a resistance ratio thereof, and generating a second voltage pulse with a second pulse width shorter than the first pulse width to apply a voltage of the second voltage pulse to the second resistance change film by a transient response of the capacitor; and
a control circuit which controls an operation to store multi-level data in the memory cell by using the first and second voltage pulses in a writing.

2. The memory of claim 1,
wherein the first pulse width is larger than a product of a capacitance of the capacitor and a resistance of the second resistance change film before applying the first voltage pulse to the memory cell, and
the second pulse width is smaller than a product of a capacitance of the capacitor and a resistance of the second resistance change film before applying the second voltage pulse to the memory cell.

3. The memory of claim 1,
wherein the first node comprises a first electrode, the second node comprises a first metal layer, the third node comprises a second electrode, the capacitor comprises the first metal layer, a second metal layer and an insulating layer therebetween, and the second metal layer contacts with the first electrode.

4. The memory of claim 1,
wherein in a writing in a situation that the first and second resistance change films are capable of storing first and second resistances, and have the first resistance in an erase state,
the control circuit makes a first write state in which each of the first and second resistance change films has the second resistance, when the first voltage pulse is applied to the memory cell,
the control circuit makes a second write state in which the first resistance change film has the first resistance and the second resistance change film has the second resistance, when the second voltage pulse is applied to the memory cell,
the control circuit makes a third write state in which the first resistance change film has the second resistance and the second resistance change film has the first resistance, when the second voltage pulse is applied to the memory cell after the first voltage pulse is applied to the memory cell, and
a voltage or a polar character of the second voltage pulse for making the third write state is different from that of the first voltage pulse and that of the second voltage pulse for making the second write state.

5. The memory of claim 4,
wherein in an erasing after the writing,
the control circuit unifies the memory cell to the first write state, when the first and second voltage pulses are applied to the memory cell, the control circuit makes the erase state, when the first voltage pulse is applied to the memory cell which is unified to the first write state, and a voltage or a polar character of the first voltage pulse for making the erase state is different from that of the first voltage pulse for making the first write state.

6. The memory of claim 4, wherein in a reading after the writing, the control circuit determines whether the memory cell has one of the erase state, the first write state, the second write state and the third write state, when the first and second voltage pulses are applied to the memory cell.

7. The memory of claim 1, wherein in a situation that the first resistance change film is capable of storing first and second resistances and have the first resistance in an erase state, and that the second resistance change film is capable of storing third and fourth resistances and have the third resistance in the erase state, the fourth resistance among the first to fourth resistances has a minimum value, the first resistance among the first to fourth resistances has a maximum value, and the second resistance is larger than the third resistance.

8. The memory of claim 7, wherein in the writing, the control circuit makes a first write state in which the first resistance change film has the second resistance and the second resistance change film has the fourth resistance, when the first and second voltage pulses are applied to the memory cell, the control circuit makes a second write state in which the first resistance change film has the first resistance and the second resistance change film has the fourth resistance, when the second voltage pulse is applied to the memory cell, and the control circuit makes a third write state in which the first resistance change film has the second resistance and the second resistance change film has the third resistance, when the first voltage pulse is applied to the memory cell.

9. The memory of claim 8, wherein in an erasing after the writing, the control circuit makes the erase state, when the first and second voltage pulses are applied to the memory cell, and a voltage or a polar character of the first and second voltage pulses in the erasing is different from that of the first and second voltage pulses in the writing.

10. The memory of claim 8, wherein in a reading after the writing, the control circuit determines whether the memory cell has one of the erase state, the first write state, the second write state and the third write state, when the first and second voltage pulses are applied to the memory cell.

11. The memory of claim 1, wherein the first and second resistance change films include the same material.

* * * * *